United States Patent
Shrivastava

(10) Patent No.: US 10,193,531 B2
(45) Date of Patent: Jan. 29, 2019

(54) DIGITAL STEP ATTENUATOR

(71) Applicant: pSemi Corporation, San Diego, CA (US)

(72) Inventor: Ravindranath Shrivastava, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 201 days.

(21) Appl. No.: 14/996,078

(22) Filed: Jan. 14, 2016

(65) Prior Publication Data

US 2017/0207769 A1   Jul. 20, 2017

(51) Int. Cl.
  *H03H 11/24* (2006.01)
  *H03K 5/08* (2006.01)
  *H03K 17/687* (2006.01)
  *H03H 7/25* (2006.01)

(52) U.S. Cl.
  CPC ............ *H03H 11/245* (2013.01); *H03H 7/25* (2013.01); *H03K 5/08* (2013.01); *H03K 17/687* (2013.01)

(58) Field of Classification Search
  CPC .......................... H03H 11/245; H02K 17/687
  USPC .......................................... 327/308; 333/81 R
  See application file for complete search history.

(56) References Cited

U.S. PATENT DOCUMENTS

| | | | |
|---|---|---|---|
| 4,187,479 A | 2/1980 | Ishizuka et al. | |
| 5,049,841 A | 9/1991 | Cooper et al. | |
| 5,157,323 A | 10/1992 | Ali et al. | |
| 5,448,207 A * | 9/1995 | Kohama | H03H 11/245 327/308 |
| 5,666,089 A | 9/1997 | Ehlers | |
| RE37,708 E * | 5/2002 | Danstrom | G05F 1/565 323/274 |
| 6,828,873 B2 | 12/2004 | Ludwig et al. | |
| 7,852,245 B2 * | 12/2010 | Sutardja | H03M 1/0678 341/120 |

(Continued)

FOREIGN PATENT DOCUMENTS

WO   2017062085   4/2017

OTHER PUBLICATIONS

Luu, An T., Office Action received from the USPTO dated Jul. 28, 2017 for U.S. Appl. No. 15/339,737, 22 pgs.

(Continued)

*Primary Examiner* — Dinh T Le
(74) *Attorney, Agent, or Firm* — Jaquez Land Greenhaus LLP; Martin J. Jaquez, Esq.; John Land, Esq.

(57) ABSTRACT

Digital step attenuator (DSA) configurations which are capable of handling high power signals, have low insertion loss and parasitic effects, have few or no glitches between state transitions, have minimal effect on chip area and power dissipation on an integrated circuit (IC) die (or "chip"), and provide flexibility of design for various applications. Embodiments utilize one or more architectural features and/or design techniques to achieve such characteristics, including reduced resistor and FET switch sizes, reduced series stack sizes, unidirectional input power configurations, capacitor compensation to match bandwidth characteristics, activating low-power thermometer-weighted attenuator cells only after activating higher power thermometer-weighted attenuator cells, and reducing signal transients (glitches) using a thermometer-weighted configuration of attenuator cells.

46 Claims, 9 Drawing Sheets

(56) References Cited

U.S. PATENT DOCUMENTS

| | | | |
|---|---|---|---|
| 8,125,264 B2* | 2/2012 | Maejima | G11O 5/145 |
| | | | 327/536 |
| 8,135,369 B2 | 3/2012 | Yamakawa | |
| 8,779,870 B2 | 7/2014 | Sun et al. | |
| 8,890,598 B2 | 11/2014 | Jordan | |
| 9,100,046 B2* | 8/2015 | Granger-Jones | H03M 1/682 |
| 9,397,635 B2* | 7/2016 | Costa | H03H 11/245 |
| 9,531,359 B1 | 12/2016 | Shrivastava | |
| 9,537,472 B2* | 1/2017 | Lu | H03K 5/08 |
| 9,935,614 B2 | 4/2018 | Shrivastava | |
| 2010/0238722 A1* | 9/2010 | Hashimoto | G11C 16/30 |
| | | | 365/185.2 |
| 2011/0148501 A1* | 6/2011 | Granger-Jones | H03H 11/245 |
| | | | 327/308 |
| 2013/0043962 A1 | 2/2013 | Granger-Jones | |
| 2014/0002214 A1 | 1/2014 | Bawell et al. | |
| 2014/0253248 A1 | 9/2014 | Ahmed et al. | |
| 2015/0137913 A1 | 5/2015 | Costa | |
| 2017/0104471 A1 | 4/2017 | Shrivastava | |

OTHER PUBLICATIONS

Rosswag, Isabella, International Search Report and Written Opinion received from the EPO dated Oct. 27, 2016 for Appln. No. PCT/US2016/043212, 17 pgs.

Durham, et al., "Circuit Architectures for High Linearity Monolithic Continuos-Time Filtering", 8090B IEEE Transactions on Circuits and Systems II: Analog and Digital Signal Processing, 39 Sep. 1992, No. 9, New York, pp. 651-657.

Luu, An T., Notice of Allowance received from the USPTO dated Aug. 31, 2016 for U.S. Appl. No. 14/878,750, 15 pgs.

IDT F1953 Datasheet, "6-bit Digital Step Attenuator", 400 to 4000 MHz IDTF1953, Glitch-Free Digital Step Attenuator, Rev 1, May 2013, pp. 1-17.

Outten, Samuel S., Office Action received from the USPTO dated Sep. 11, 2015 for U.S. Appl. No. 14/084,439, 13 pgs.

Costa, Damien, Amendment filed in the USPTO dated Dec. 30, 2015 for U.S. Appl. No. 14/084,439, 16 pgs.

Outten, Samuel S., Notice of Allowance received from the USPTO dated Mar. 22, 2016 for U.S. Appl. No. 14/084,439, 7 pgs.

Shrivastava, Ravindranath, "Multi-State Attenuator", application as filed in the USPTO, filed Oct. 8, 2015, U.S. Appl. No. 14/878,750, 57 pgs.

Trafidlo, Renata, Written Opinion received from the EPO dated Sep. 19, 2017 for appln. No. PCT/US2016/043212, 11 pgs.

Shrivastava, Ravindranath, Response filed in the USPTO dated Oct. 6, 2017 for U.S. Appl. No. 15/339,737, 9 pgs.

Peregrine Semiconductor Corporation, Response filed in the EPO dated Nov. 16, 2017 for appln. No. PCT/US2016/043212, 23 pgs.

Luu, An T., Notice of Allowance received from the USPTO dated Jan. 2, 2018 for U.S. Appl. No. 15/339,737, 19 pgs.

* cited by examiner

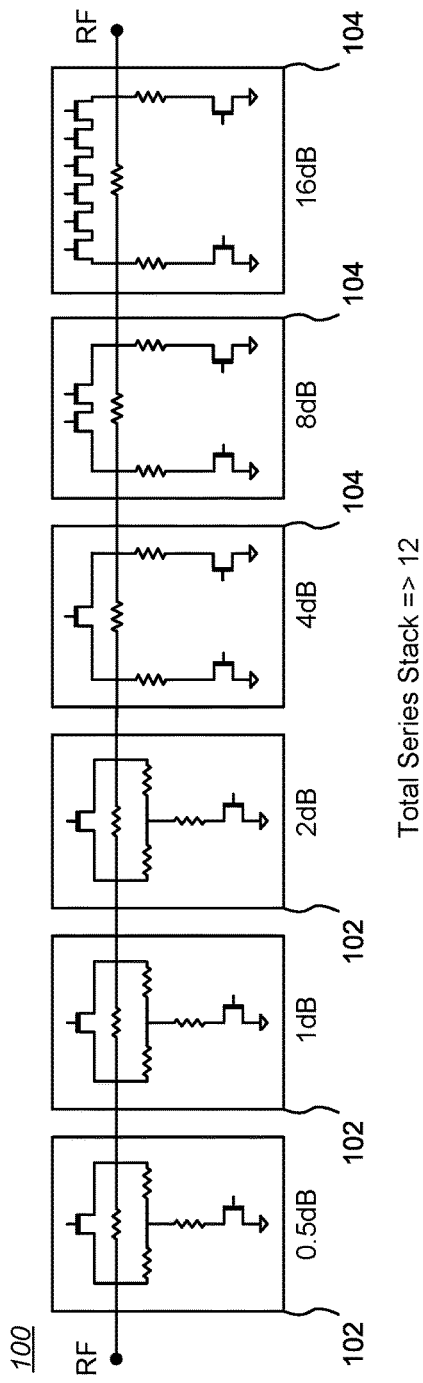
FIG. 1A
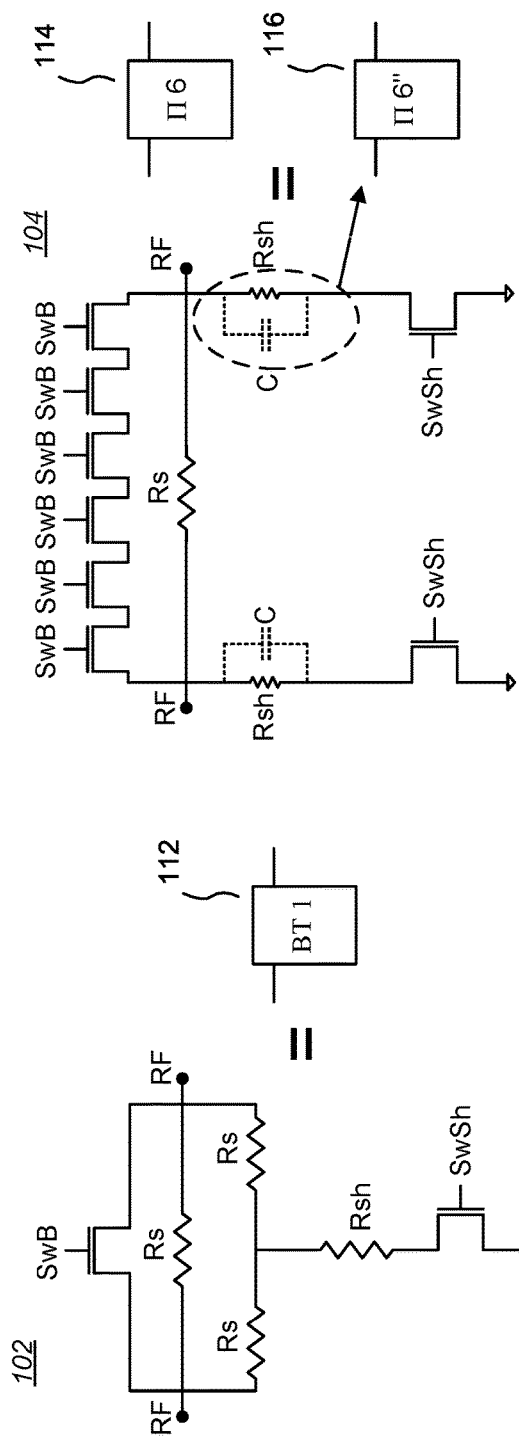
FIG. 1B
FIG. 1C

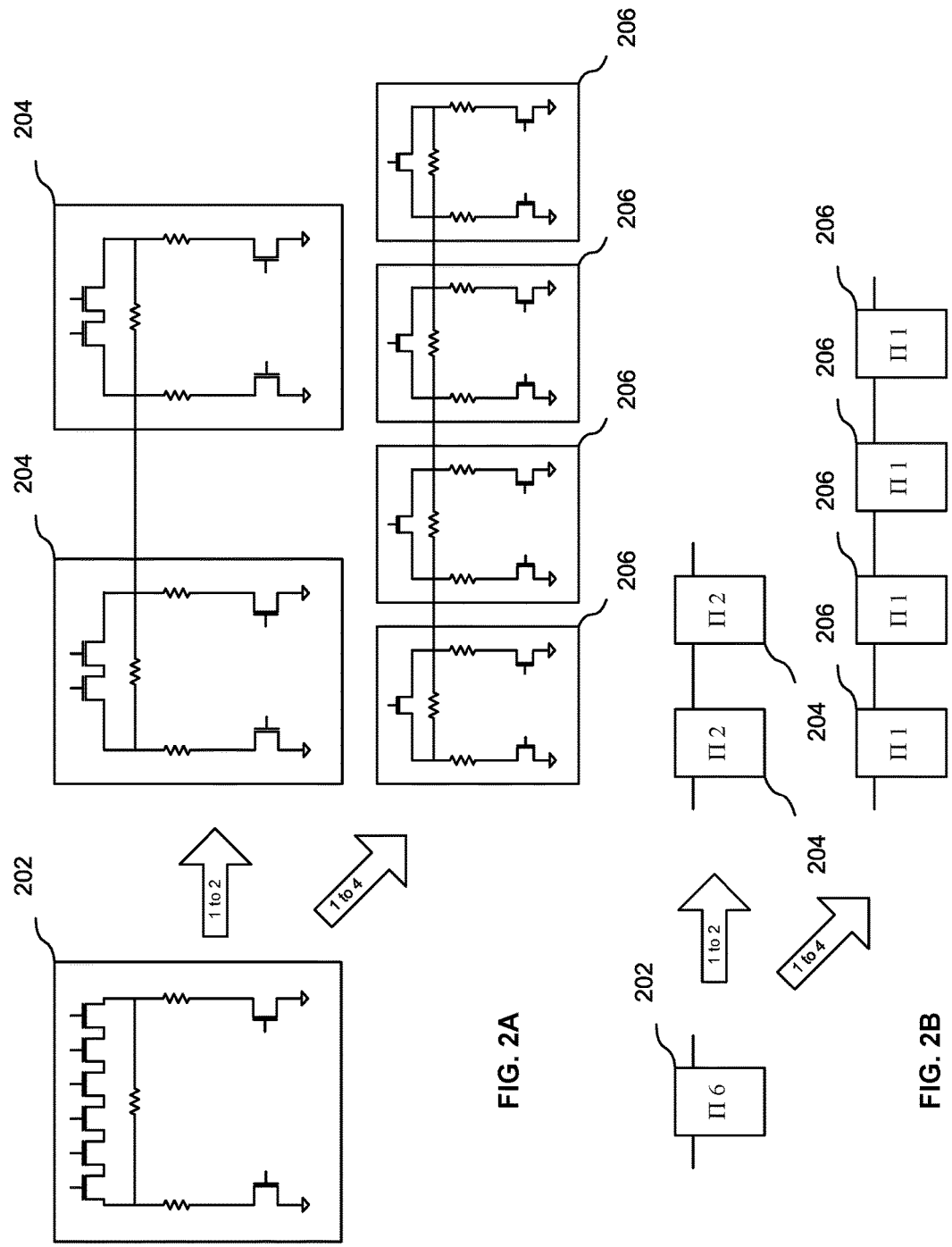

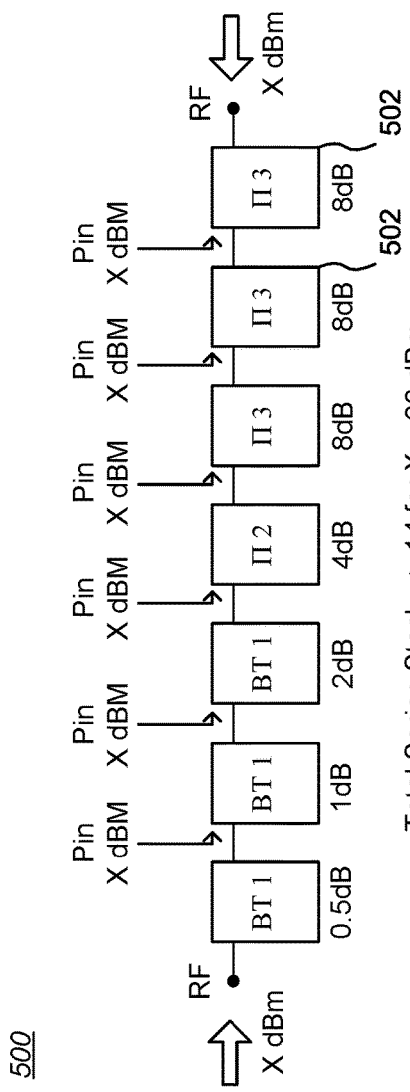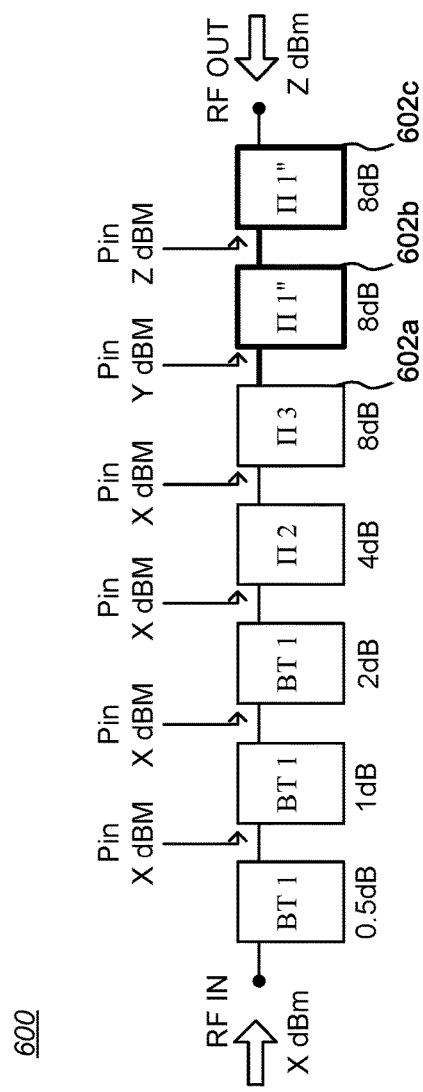

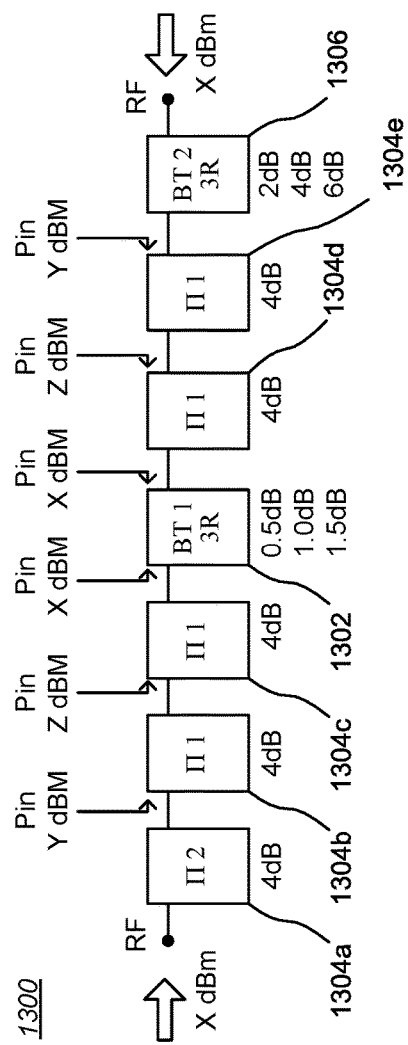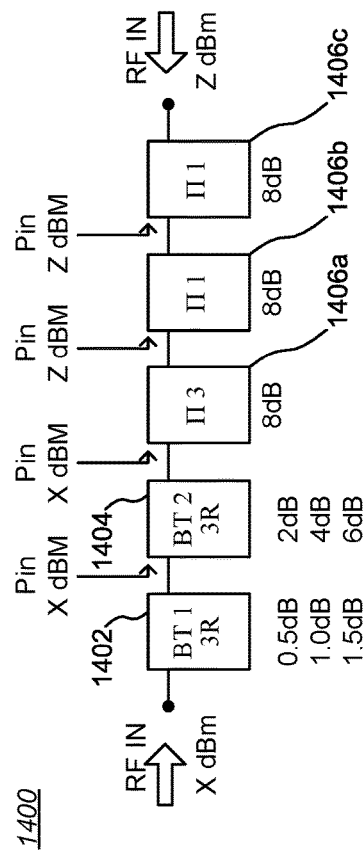
FIG. 13
FIG. 14

DIGITAL STEP ATTENUATOR

CROSS-REFERENCE TO RELATED APPLICATIONS

This application is related to the following applications:
U.S. patent application Ser. No. 14/084,439, Publication No. US20150137913 A1, filed Nov. 19, 2013, entitled "Segmented Attenuator with Glitch Reduction" and assigned to the assignee of the present invention and application, the teachings of which are hereby incorporated by this reference; and
U.S. patent application Ser. No. 14/878,750, filed Oct. 8, 2015, entitled "Improved Multi-State Attenuator" and assigned to the assignee of the present invention and application, the teachings of which are hereby incorporated by this reference.

BACKGROUND (1) Technical Field

This invention relates to electronic circuits, and more particularly to signal attenuator circuits.

(2) Background

A signal attenuator is an electronic device that reduces the power of a signal without appreciably distorting its waveform, and is frequently used to lower voltage, dissipate power, and/or improve impedance matching. An attenuator is functionally the opposite of an amplifier (although the two work by different methods)—while an amplifier provides gain, an attenuator provides loss (or, equivalently, a gain less than one).

Attenuators may be passive devices made from simple voltage divider networks. However, for radio frequency (RF) applications, attenuators more typically comprise a small network of passive (and, optionally, active) devices. Classic examples of single-valued RF attenuators are two-port bridged-T type, pi-type, T-type, and L-pad type attenuators.

It is known to serially connect multiple single-valued RF attenuators of various types to provide for a selectable amount of attenuation in a circuit. Sometimes known as a digital step attenuators (DSAs), such attenuators are frequently used with RF systems such as transceivers for broadcast radio, cellular telephones, RF-based data networks (e.g., WiFi, Bluetooth), and RF test instruments.

A conventional DSA consists of a series cascade of switchable single-valued RF attenuator cells, with binary weighted attenuation values; a more advanced type of DSA includes both binary and thermometer weighted attenuator cells. Examples of that latter type of DSAs are shown in U.S. patent application Ser. No. 14/084,439 referenced above.

A switchable attenuator cell is designed to have two selectable states: (1) an attenuation state, and (2) a bypass or "through" state. The bypass state is normally provided by a switch connected in parallel with the input and output ports of an attenuator network (e.g., two-port bridged-T type, pi-type, T-type, and L-pad type attenuators). The switch is typically a field effect transistor (FET), and is commonly a MOSFET.

To withstand high input power in conventional DSAs, a number of bypass switches (e.g., FETs) may be series connected or "stacked" within an attenuator cell to withstand the increased applied voltage and power levels. However, an increase in the series stack size leads to increases in insertion loss (IL), parasitic capacitances and inductances, integrated circuit (IC) die area, and power dissipation.

Conventional thermometer or mixed binary/thermometer weighted DSAs can even make the problem worse compared to binary weighted DSAs because of the increased number of attenuator cells needed for thermometer weighting. If each thermometer attenuator cell is designed to withstand high power, the total series stack size becomes very large, thereby exacerbating the problems noted above.

The present invention addresses the above limitations of existing DSAs, and includes a number of embodiments that have reduced IL, parasitic capacitances and inductances, IC die area, and power dissipation compared to conventional DSA circuits.

SUMMARY OF THE INVENTION

The present invention is directed to providing a number of digital step attenuator (DSA) configurations which are capable of withstanding high power signals, have low insertion loss (IL) and parasitic effects, have few or no glitches between state transitions, have minimal effect on IC die area and power dissipation, and provide flexibility of design for various applications. DSA embodiments in accordance with the present invention utilize one or more of the following architectural features and/or design techniques to achieve such characteristics:

a reduction in the size of the attenuation resistors per attenuator cell, thus reducing IC die area and parasitic elements;

a reduction in the series field effect transistor (FET) stack size of some of the attenuator cell configurations by replacing a higher attenuation cell with two or more lower attenuation cells, which can reduce IC die area, improve IL, and maintain matching bandwidth characteristics;

a reduction in the series FET stack size (and thus IL) of some of the attenuator cell configurations by using a unidirectional input power configuration;

a reduction in the width/length (W/L) ratio of the series FET(s) in some attenuator cell configurations, thus reducing series FET stack size and hence IC die area while maintaining matching bandwidth characteristics;

a reduction in IL due to a reduction in series FET stack size of one or more attenuator cells compared to conventional DSA circuits;

the ability to use smaller attenuator cell values (e.g., 8 dB or 4 dB or lower) to significantly improve the bandwidth of a DSA;

use of one or more multi-state attenuator cells to reduce the total series stack size of a DSA and thus reduce IL;

use of capacitor compensation in attenuator cells to achieve matching bandwidth characteristics;

the ability to withstand bidirectional high input power without increasing IL by ensuring that one or more lower-power thermometer-weighted attenuator cells (i.e., cells not capable of withstanding the maximum incident power) cannot be activated (i.e., set to an ON state) until after activation of at least one higher-power thermometer-weighted attenuator cell capable of withstanding the maximum incident power and collectively providing sufficient attenuation to lower the incident power to the lower-power thermometer-weighted attenuator cells to a level that can be withstood by such cells; and reducing signal transients (glitches) that may occur between state transitions by using, at least in part, a thermometer-weighted configuration of attenuator cells.

Some embodiments include bridged-T type, pi-type, T-type, and/or L-pad type multi-state attenuator cells each having a programmable throughput section and a coupled programmable shunt section, such that multiple attenuation states and corresponding impedance matching states may be programmatically selected for each such cell.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 1A is a block diagram of a conventional binary weighted DSA.

FIG. 1B is a schematic diagram of the switched bridged-T type attenuator cell from FIG. 1A.

FIG. 1C is a schematic diagram of the pi-type attenuator cell from FIG. 1A.

FIG. 2A is a block diagram showing a replacement of a high attenuation (e.g., 16 dB) cell with either two intermediate attenuation (e.g., 8 dB) cells or four lower attenuation (e.g., 4 dB) cells.

FIG. 2B is a block diagram showing the same replacement options as in FIG. 2A, but using block symbols of the type described above with respect to FIG. 1C.

FIG. 5 is a block diagram of a DSA in which the highest binary-weighted attenuator cell of FIG. 3 (e.g., 16 dB) has been replaced by two lower thermometer-weighted attenuator cells (e.g., 8 dB each).

FIG. 6 is a block diagram of a DSA variant similar to the DSA of FIG. 5, but having defined RF IN and RF OUT ports.

FIG. 13 is a block diagram of one example of a DSA that is a re-arranged variant of the DSA of FIG. 9 capable of handling bidirectional high power.

FIG. 14 is a block diagram of a unidirectional DSA variant using multiple multi-state attenuator cells.

Like reference numbers and designations in the various drawings indicate like elements.

DETAILED DESCRIPTION OF THE INVENTION

Figure 3:
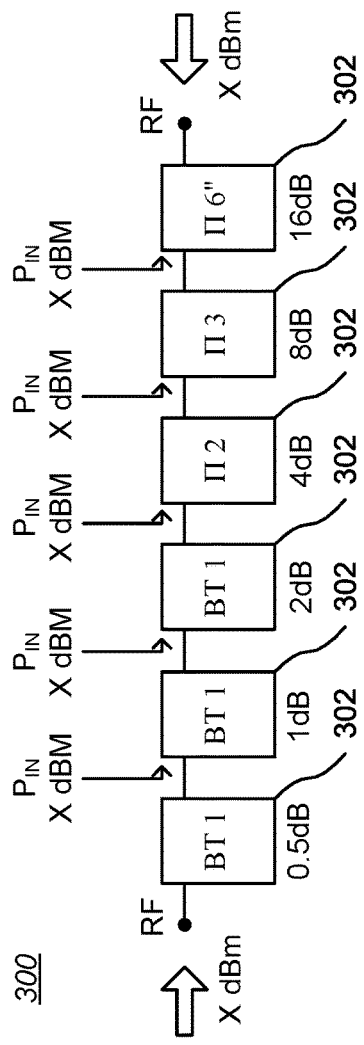
FIG. 3 is a block diagram of a conventional DSA in which the attenuator cells are configured to withstand X dBm of incident input power at either RF port.

The present invention encompasses radio frequency (RF) digital step attenuators (DSAs) which are capable of withstanding high power signals, have low insertion loss (IL) and parasitic effects, have few or no glitches between state transitions, have minimal effect on IC die area and power dissipation, and provide flexibility of design for various applications.

Design Considerations—Bandwidth and Insertion Loss

Designing a high-performance RF DSA requires consideration of a number of sometimes conflicting design issues. For example, FIG. 1A is a block diagram of a conventional binary weighted DSA 100. This particular DSA has 6 selectable attenuator cells: 3 switched bridged-T type 102 and 3 switched pi-type 104, each cell having a different attenuation level as indicated. In this example, the DSA can provide $2^6$ levels of attenuation (including the bypass state) to a signal applied to either RF port by setting each cell to either an attenuation state or a bypass state in any 6-bit binary combination; the illustrated DSA provides 31.5 dB of maximum attenuation and a least significant bit (LSB) of 0.5 dB.

FIG. 1B is a schematic diagram of the switched bridged-T type attenuator cell 102 from FIG. 1A. One or more series-connected FET bypass switches SwB are coupled between RF ports (one switch is shown). Also coupled between the RF ports is a conventional bridged-T type attenuator circuit that includes a set of series resistors Rs, a shunt resistor Rsh selected for impedance matching, and a shunt switch SwSh connected as shown. The shunt switch SwSh may also be implemented as a stack of FET devices. For both the bypass switches SwB and the shunt switches SwSh, the stack size (i.e., the number of series connected FETs) depends on the input power of the signal applied to the DSA. A T-type attenuator (not shown) has a similar structure, but without a series resistor Rs bridging the RF ports.

In a bypass or through state, bypass series switch SwB is ON (conductive) and shunt switch SwSh is OFF (blocking or non-conductive). In an attenuation state, the switches are reversed: bypass series switch SwB is OFF and shunt switch SwSh is ON. The specific attenuation value of any of the bridged-T type attenuator cells 102 is determined by the values set for the series resistors Rs and shunt resistor Rsh, in known fashion.

The bridged-T type attenuator cell 102 may also be represented by a block symbol 112, with the "BT" representing the attenuator type (bridged-T) and a number (here, "1") representing the number of bypass series switches SwB. Similarly, a T-type attenuator cell (not shown) may also be represented by a block symbol with a "T" representing the attenuator type (T-type) and a number representing the number of bypass series switches SwB.

FIG. 1C is a schematic diagram of the pi-type attenuator cell 104 from FIG. 1A. One or more series-connected FET bypass switches SwB are coupled between RF ports (6 switches are shown). Also coupled between the RF ports is a conventional pi-type attenuator circuit that includes a series resistors Rs bracketed by parallel shunt legs each comprising a shunt resistor Rsh and a shunt switch SwSh, all connected as shown. Again, the shunt switch SwSh may also be implemented as a stack of FET devices. For both the bypass switches SwB and the shunt switches SwSh, the stack size depends on the input power of the signal applied to the DSA. An L-pad type attenuator (not shown) has a similar structure, but with only a single shunt leg.

In a bypass or through state, all of the bypass series switches SwB are ON and both shunt switches SwSh are OFF. In an attenuation state, the switches are reversed: all of the series switches SwB are OFF and both shunt switches SwSh are ON. Again, the specific attenuation value of any of the pi-type attenuator cells 104 is determined by the values set for the series resistor Rs and shunt resistors Rsh, in known fashion.

The pi-type attenuator cell 104 may also be represented by a block symbol 114 with the "H" representing the attenuator type (pi) and a number (here, "6") representing the number of bypass series switches SwB. Similarly, an L-pad type attenuator cell (not shown) may also be represented by a block symbol with an "L" representing the attenuator type (L-pad) and a number representing the number of bypass series switches SwB.

In some embodiments, an optional compensation capacitor C may be included in parallel with each shunt resistor Rsh to improve the bandwidth of an attenuator cell; one such variant is shown in FIG. 1C. Such variants may be indicated in a block symbol by including a double-prime symbol indicating the optional compensation capacitors C; for example, the variant pi-type attenuator cell 104 with optional capacitor C may be represented by a block symbol 116 with the "H" representing the attenuator type (pi), a number (here, "6") representing the number of bypass series switches SwB, and a double-prime symbol indicating the optional compensation capacitor(s) C. Adding capacitor compensation does run into the risk of degrading the return loss of an attenuator cell as function of frequency since, for higher frequencies, the input/output of an attenuator cell looks capacitive.

The total minimum series stack size of the DSA example shown in FIG. 1A is determined by counting the number of FET bypass switches SwB in the bypass paths between the RF ports; in the illustrated example, the total minimum series stack size is 12, with the 16 dB attenuator cell 104 alone contributing half of that total.

The bandwidth of the illustrated DSA is limited by the design of the highest (16 dB) attenuator cell. The OFF capacitance ($C_{OFF}$) of the FET series switches SwB and the value of the series resistors Rs ultimately determine the bandwidth of the 16 dB attenuator cell. TABLE 1 sets forth the Rs and Rsh values for the 4 dB, 8 dB, and 16 db attenuator cells for one modeled example of the circuit shown in FIG. 1A:

TABLE 1

| Atten. (dB) | Rsh (ohms) | Rs (ohms) |
|---|---|---|
| 4 | 221.0 | 23.8 |
| 8 | 116.1 | 52.8 |
| 16 | 68.8 | 153.8 |

As can be seen from TABLE 1, the values of the series resistor Rs increase as the attenuation level increases, but, importantly, do not scale linearly with the level of attenuation. For example, comparing the Rs value for the 8 dB and 16 dB attenuators shows that Rs goes up by more than a factor of 3 while attenuation only goes up by a factor of 2.

In order to maintain the same bandwidth for all of the attenuator cells 102, 104, the zero of the transfer function for the $C_{OFF}$ of the series FETs and the series resistors Rs should be present at the same frequency for all cells. The $C_{OFF}$ of the series FETs has to be scaled accordingly for each attenuator cell to maintain the same bandwidth for each cell. Thus, if the series resistors Rs increase in value to provide an increase in attenuation, then $C_{OFF}$ has to scale down. As one example, using the Rs and Rsh values set forth in TABLE 1, for the 16 dB cell to have the same bandwidth as the 4 dB cell, the $C_{OFF}$ of the series FETs in the 16 dB cell has to be reduced by a factor K of about 6.5 (153.8/23.6). However, as the series FETs are scaled down in width/length (W/L) ratio to reduce $C_{OFF}$ to maintain the same bandwidth for all attenuator cells, the ON resistance ($R_{ON}$) of the series FETs increases, thereby increasing the IL of the attenuator cells.

The conflicting design tradeoffs between $C_{OFF}$ and $R_{ON}$, related as they are to bandwidth matching and IL, can be mitigated by redesigning the conventional circuit configuration shown in FIG. 1A. In particular, a higher attenuator cell can be replaced by multiple series-connected attenuator cells that provide approximately the same total attenuation. For example, the 16 dB attenuator cell in FIG. 1A can be replaced with two series-connected 8 dB cells or by four series-connected 4 dB cells. A notable aspect of this kind of replacement is that each attenuator cell of each set of replacement cells has approximately the same bandwidth as the single higher level attenuator cell, but the set of replacement cells has lower IL as compared to the single higher level attenuator cell.

More generally, FIG. 2A is a block diagram showing a replacement of a high attenuation (e.g., 16 dB) cell 202 with either two intermediate attenuation (e.g., 8 dB) cells 204 or four lower attenuation (e.g., 4 dB) cells 206. FIG. 2B is a block diagram showing the same replacement options as in FIG. 2A, but using block symbols of the type described above with respect to FIG. 1C. As other examples, the replacement cells may be one 8 dB attenuator cell 204 and three 4 dB attenuator cells 208, or five 3.2 dB attenuator cells.

Of particular note is that the total number of series FETs will generally decrease by replacing a higher attenuation cell with multiple lower attenuation cells totaling approximately the same level of attenuation (e.g., two intermediate attenuator cells 204 or four lower attenuator cells 206). Thus, replacing the 16 dB attenuator cell (stack size=6) in the DSA 100 of FIG. 1A with either two 8 dB attenuator cells (stack size for each=2) or four 4 dB attenuator cells (stack size for each=1) reduces the total series stack size of the DSA 100 from 12 to 10, thus reducing IL while maintaining matching bandwidth characteristics for the attenuator cells. As should be clear, other replacements may be made that would reduce the total series stack size of the DSA 100 while maintaining matching bandwidth characteristics.

Power Handling

Power handling is another factor that should be taken into account in designing a DSA. In a conventional binary-weighted DSA, each attenuator cell is designed to withstand the total incident input power, since, at any given setting, any one attenuator cell may be the only active ON state cell to which the incident input power is applied. For example, FIG. 3 is a block diagram of a conventional DSA 300 in which the attenuator cells 302 are configured to withstand X dBm of incident input power at either RF port. The notations and arrows above the intermediate attenuator cells 302 show that each such cell is subjected to the same power level, $P_{IN}=X$ dBm.

As one example of power handling as it affects DSA design, assume an input signal power level of 30 dBm and the limits shown in TABLE 2 for Vgs (or Vgd) and Vds for the DSA series FET switches Rs.

TABLE 2

RF Switch Maximum Operating Voltage

| Operating Condition | Vgs/Vgd | Vds |
|---|---|---|
| ON | 4.0 | 1.0 |
| OFF | −4.6 | 3.3 |

Using these values, a minimum series stack size can be determined for each of the attenuator cells 302 for a particular fabrication technology (e.g., CMOS on SOI). Based on power handling requirements alone for the selected fabrication technology, TABLE 3 sets forth the minimum series stack size required for each of the attenuator cells of the DSA 300 shown in FIG. 3. In TABLE 3, the OFF operation condition for Vds_MAX (e.g., the 3.3 volt value from TABLE 2) is used along with Vgs in determining stack height. In low insertion loss applications as described here, Vds in the ON operational condition is typically much less than 1 volt and generally not a dominant factor in determining stack height. Note that the voltage limits in TABLE 2 may change if the fabrication technology changes, which will in turn change the minimum stack sizes in TABLE 3.

TABLE 3

| Attenuator Cell | Input Power (dBm) | Voltage Drop across Attenuator | Minimum Stack Size | Vgs_MAX (V) | Vds_MAX in OFF state (V) |
|---|---|---|---|---|---|
| 0.5 | 30 | 0.6 | 1 | 3.7 | 0.6 |
| 1.0 | 30 | 1.1 | 1 | 3.9 | 1.1 |
| 2.0 | 30 | 2.1 | 1 | 4.4 | 2.1 |
| 4.0 | 30 | 3.7 | 2 | 4.3 | 1.8 |
| 8.0 | 30 | 6.0 | 3 | 4.4 | 2.0 |
| 16.0 | 30 | 8.4 | 4 | 4.5 | 2.1 |

At these assumed FET voltage limits and power level for the DSA 300 in FIG. 3, the 4 dB attenuator cell will require a series FET stack size of 2 rather than 1 (as shown in FIG. 1A), and the 8 dB attenuator cell will require a series FET stack size of 3 rather than 2 (as shown in FIG. 1A). However, the stack size for the higher attenuator cells may need to be increased to achieve the same bandwidth as the lesser attenuator cells. Based on TABLE 3 alone, the 16 dB attenuator of the DSA 300 only requires a stack size of 4 to meet the power handling requirements, but requires a stack size of 6 to meet bandwidth requirements, as discussed above. Thus, the total minimum stack size for the illustrated example increases from 12 (as in FIG. 1A) to 14 in order to not only withstand the example signal power and voltage limits, but also maintain matching bandwidth characteristics among the attenuator cells 302.

Some attenuator cells 302 may require capacitive compensation, depending on the required bandwidth. Since the stack size of the 4 dB and the 8 dB attenuator cells 302 has increased in the illustrated example, so will their bandwidth increase. For the 16 dB attenuator cell 302 to meet that increased bandwidth, some capacitor compensation may be required; such compensation is indicated in FIG. 3, where the block symbol for the 16 dB attenuator cell 302 includes a double-prime symbol.

For the configuration shown in FIG. 3, the total minimum series FET stack size has now increased to 14 from 12 (as in FIG. 1A). The total minimum stack size will keep on increasing as the input power increases above the example level of 30 dBm to ensure that the FET series stack can withstand the voltage drop across the attenuator cells 302 in the ON state. Higher power handling also requires an increase in the Rsh shunt stack size of each attenuator cell 302; that is, while the shunt stack size is independent of the attenuation level of an attenuator cell, the shunt stack size does depend on upon the applied input power (as well as the FET voltage limits of a particular fabrication technology).

Figure 4:
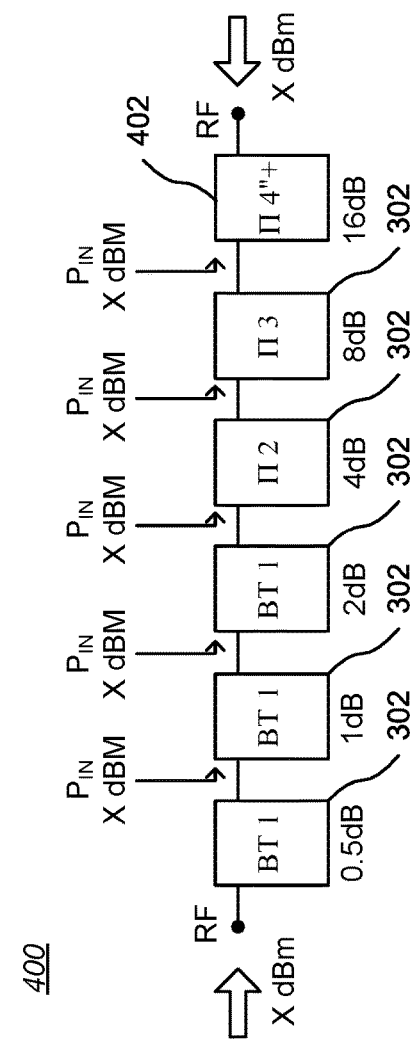
FIG. 4 is a block diagram of a DSA in which the number of series FETs of the highest attenuator cell (16 dB in this case) are reduced compared to the highest attenuator cell FIG. 3, thus reducing the total minimum series stack size from 14 (as in FIG. 3) to 12.

By way of illustrating some of the tradeoffs involved in designing a DSA, if the CUFF of the series FETs in one or more attenuator cells is reduced by shrinking the width of the FETs, the same bandwidth requirement can be met with a smaller series stack size (e.g., 4 rather than 6). Reducing CUFF in this manner will shrink the layout of an IC. Bandwidth can also be increased by adding compensation capacitors. However, $R_{ON} \times C_{OFF}$ is a constant, and thus reducing $C_{OFF}$ would result in a higher equivalent $R_{ON}$ and the insertion loss in both cases would remain the same. In contrast, if the series stack size is reduced (for example, from 6 to 4) without shrinking the size of the series FETs, then insertion loss will improve since the total $R_{ON}$ of the small stack would be lower. FIG. 4 is a block diagram of a DSA 400 in which the number of series FETs of the highest attenuator cell 402 (16 dB in this case) are reduced compared to the highest attenuator cell 302 FIG. 3, thus reducing the total minimum series stack size from 14 (as in FIG. 3) to 12. The DSA 400 of FIG. 4 will thus have lower IL compared to the DSA 300 shown in FIG. 3. However, the equivalent $C_{OFF}$ of attenuator cell 402 will be higher than the $C_{OFF}$ of the highest attenuator cell 302, which will reduce the bandwidth of the 16 dB cell in the DSA 400.

In the embodiment illustrated in FIG. 4, extra capacitor compensation (indicated by the "+" symbol) has been included in the highest attenuator cell 402 to match the bandwidth of the other attenuator cells 302 caused by the reduction in stack size for the highest attenuator cell 402. The return loss of the highest attenuator cell 402 (here, 16 dB) may be degraded due to such capacitive compensation. In addition, if the compensation capacitor is too large, then the degraded return loss will limit the bandwidth of the DSA 400. In such cases and in order to achieve the necessary matching bandwidth, it is beneficial to use the cell replacement concept described above. Thus, for example, the 16 dB attenuator cell 402 may be replaced with either four 4 dB attenuator cells or two 8 dB attenuator cells.

Note that while this and other disclosed example embodiments use 30 dBm as an example maximum signal power level, the invention encompasses other maximum signal power levels, and indeed is particularly well suited to handle power levels of greater than about 30 dBm by increasing the stack size of selected attenuator cells.

Thermometer DSA Embodiments

When using the cell replacement concept described above, the multiple replacement attenuator cells are preferably connected in a serial thermometer configuration, so that increasing attenuation levels are achieved by progressively switching successive attenuator cells into circuit and decreasing attenuation levels are achieved by progressively switching successive attenuator cells out of circuit. However, depending on power handling requirements, replacing one higher attenuation cell with two or more lower attenuation cells may result in the same or even higher IL due to the number of series FETs required in each replacement attenuator cell to withstand a specified power level. For example, FIG. 5 is a block diagram of a DSA 500 in which the highest binary-weighted attenuator cell of FIG. 3 (e.g., 16 dB) has been replaced by two lower thermometer-weighted attenuator cells 502 (e.g., 8 dB each). As in FIG. 3, the total minimum stack size is 14, and accordingly the replacement does not benefit IL at this particular power level (30 dBm).

In the examples described so far, the various DSA embodiments have been treated as symmetrical, in that it has been assumed that input power may be applied to either RF port. However, the IL figure for the DSA 500 can be improved if one of the ports of the DSA 500 is defined as an RF IN port and the other port is defined as an RF OUT port. Improved IL improves the bandwidth of the DSA and offsets or eliminates degradation of the return loss if capacitor compensation is used to improve bandwidth.

FIG. 6 is a block diagram of a DSA variant similar to the DSA 500 of FIG. 5, but having defined RF IN and RF OUT ports. Assuming an input signal power level X=30 dBm, the parameters set forth in TABLE 2, and that the thermometer-weighted cells are set to ON states in the left-to-right order depicted, because of thermometer weighting, the first 8 dB attenuator cell 602a will necessarily be activated (turned ON) before either the second 8 dB attenuator cell 602b or the third 8 dB attenuator cell 602c are activated. Similarly, the second 8 dB attenuator cell 602b will necessarily be activated before the third 8 dB attenuator cell 602c is activated. Accordingly, the power of any incident signal at the RF IN port is attenuated before reaching the second and third 8 dB attenuator cells 602b, 602c, and neither attenuator cell 602b, 602c will have to withstand the full 30 dBm incident power when in an ON state.

In particular, the maximum power that will be incident on the second 8 dB attenuator cell 602b will be no more than Y=22 dBm (i.e., 30 dBm-8 dB), and the maximum power that will be incident on the third 8 dB attenuator cell 602c will be no more than Z=14 dBm, if the thermometer weighted cells are set to ON states in the left-to-right order depicted. Using these values, a minimum series stack size can be determined for each of the attenuator cells 602b, 602c for a particular fabrication technology (e.g., CMOS on SOI). Based on these power handling requirements alone, TABLE 4 sets forth the minimum series stack size required for the second and third 8 db attenuator cells 602b, 602c of the DSA 600 shown in FIG. 6. As in TABLE 3 above, the OFF operation condition for Vds_MAX (3.3 volts in this example) is used along with Vgs in determining stack height. Again, depending upon the fabrication technology being used, the voltage limits in TABLE 2 may change, which will in turn change the minimum stack sizes in TABLE 4.

TABLE 4

| Attenuator Cell | Input Power (dBm) | Voltage Drop across Attenuator | Minimum Stack Size | Vgs_MAX (V) | Vds_MAX in OFF state (V) |
|---|---|---|---|---|---|
| 4.0 | 26 | 2.3 | 1 | 4.6 | 2.3 |
| 4.0 | 22 | 1.5 | 1 | 4.1 | 1.5 |
| 8.0 | ≤22 | 2.4 | 1 | 4.6 | 2.4 |

Accordingly, the number of series FETs required for the second and third 8 dB attenuator cells 602b, 602c may be reduced, in this case, from 3 FETs each to 1 FET each, as indicated in FIG. 6. Compared to the DSA 500 of FIG. 5, the total minimum number of series FETs is reduced from 14 to only 10, and the DSA 600 will accordingly have improved IL compared to the DSA 500 of FIG. 5. Any degradation in the bandwidth of the second and third 8 dB attenuator cells 602b, 602c can be countered by adding or increasing the compensation capacitors (as indicated by the double-prime symbols).

Note that since the minimum stack size for an 8 dB attenuator cell is already at one FET for 22 dBM of input power, the same cell design can be used for both the second 8 dB and third 8 dB attenuator cells 602b, 602c, even though the maximum power seen by the third 8 dB attenuator cell 602c is only 14 dBm in this example. However, because the third 8 dB attenuator cell 602c needs to only withstand 14 dBm, a designer can shrink the attenuation resistors in that cell to dissipate only that amount of applied power, making the cell layout more compact.

Note also that while the third 8 dB attenuator cell 602c should only see 14 dBm if the thermometer weighted 8 dB attenuator cells 602a-602c are set to ON states in the left-to-right order depicted, there may be applications where it is desirable to activate such attenuator cells in a different order (e.g., attenuator cell 602a first, then attenuator cell 602c, then attenuator cell 602b last), so long as each attenuator cell is designed to handle the applied power levels that may be applied in such a switching order. Accordingly, it may be prudent in such cases to design the attenuator cells that will see a lesser power level to each withstand the largest amount of power that might be applied to any of such attenuator cells. For example, in FIG. 6, even though the maximum power seen by the third 8 dB attenuator cell 602c is only 14 dBm in the illustrated example, that attenuator cell 602c could be designed to withstand 22 dBm of power since it could be configured to be activated before the second 8 dB attenuator cell 602b.

Figure 7:
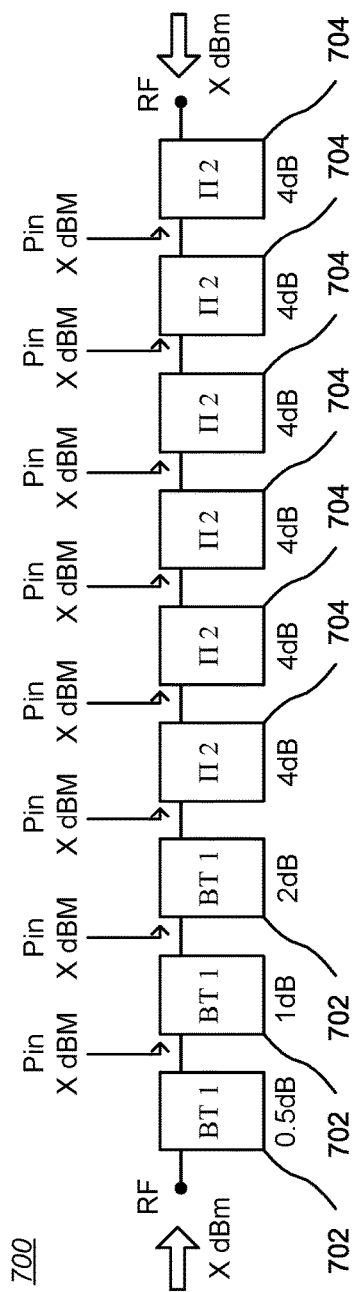
FIG. 7 is a block diagram of a DSA that includes binary-weighted attenuator cells (e.g., 0.5 dB to 2 dB) and thermometer-weighted attenuator cells (e.g., 4 dB each).

FIG. 7 is a block diagram of a DSA 700 that includes binary-weighted attenuator cells 702 (e.g., 0.5 dB to 2 dB) and thermometer-weighted attenuator cells 704 (e.g., 4 dB each). In the illustrated embodiment, the binary-weighted attenuator cells 702 enable attenuation levels from 0 dB to 3.5 dB in increments of 0.5 dB, while the thermometer-weighted attenuator cells 704 enable attenuation levels from 0 dB to 24 dB in 4 dB increments. Combining the two sections enables attenuation levels from 0 dB to 27.5 dB in increments of 0.5 dB. Of course, other attenuation values may be selected for each attenuator cell, and the number of attenuator cells may be lesser or greater. Further, it is not a requirement that all of the thermometer-weighted attenuator cells in a DSA have the same value. For example, a thermometer-weighted DSA may include three 4 dB attenuator cells and four 2 dB attenuator cells, or one 8 dB attenuator cell and three 4 dB attenuator cells.

As in FIG. 5, the DSA 700 is configured to have either RF port withstand the maximum specified input power (e.g., 30 dBm). The total minimum stack size of the illustrated embodiment is 15; hence, this configuration leads to an increase in the number of series FETs and in turn to an increase in IL.

Figure 8:
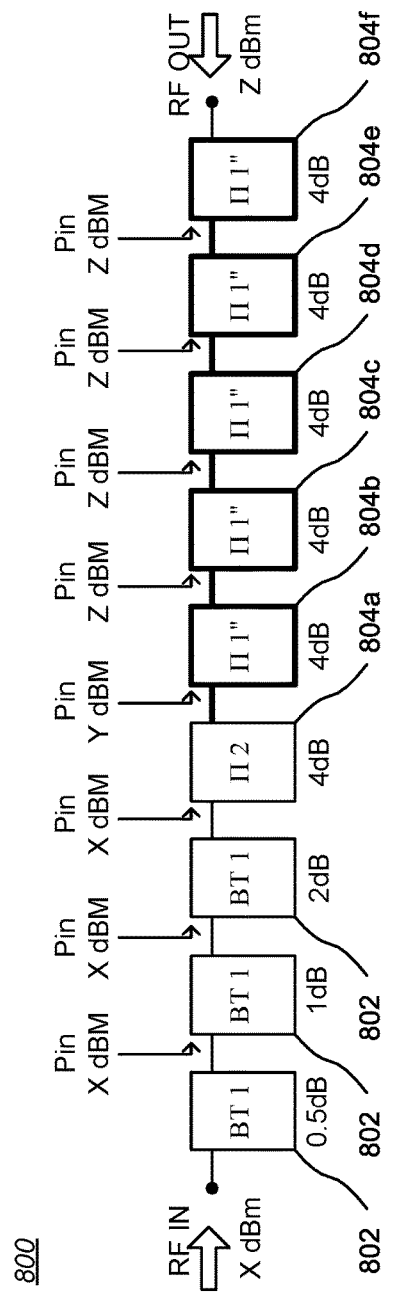
FIG. 8 is a block diagram of a DSA that includes binary-weighted attenuator cells (e.g., 0.5 dB to 4 dB) and thermometer-weighted attenuator cells (e.g., 4 dB each), but having defined RF IN and RF OUT ports.

The concepts described above with respect to the DSA 600 of FIG. 6 may be applied to the DSA 700 of FIG. 7. FIG. 8 is a block diagram of a DSA 800 that includes binary-weighted attenuator cells 802 (e.g., 0.5 dB to 2 dB) and thermometer-weighted attenuator cells 804a-804f (e.g., 4 dB each), but having defined RF IN and RF OUT ports. As a result, some of the thermometer-weighted attenuator cells 804b-804f can have a lower minimum stack size than in the DSA 700 of FIG. 7.

More particularly, in the illustrated embodiment, if the incident power at the RF IN port is X=30 dBm, then the 4 dB attenuator cell 804a must be able to withstand X=30 dBm of incident power when in the ON state, since there is no guarantee that any of the binary weighted attenuator cells 802 will be ON to attenuate any of the incident signal power. However, the 4 dB attenuator cell 804b will see only Y=26 dBm incident power when in the ON state. Under the assumptions set forth in TABLE 2 and as shown in TABLE 4 above, for a 4 dB attenuator cell which only has to withstand 26 dBm, the series stack size can be reduced to only one FET. Moving to the next 4 dB attenuator cell 804c, the incident power in the ON state is even further reduced, to no more than Z=22 dBm, and the series stack size can also be reduced to only one FET for the remaining 4 dB attenuator cells 804c-804f. (However, as noted above, it may be prudent to design the attenuator cells that will only have to withstand a lesser power level to each withstand the largest power that might be applied to any of such lower-power attenuator cells).

The resulting series stack size for the DSA 800 is 10, a significant reduction from the series stack size of 15 for the DSA 700 of FIG. 7. Accordingly, the IL for the DSA 800 of FIG. 8 will be significantly lower than the IL for the DSA 700 of FIG. 7. While the reduction in stack size for the DSA 800 of FIG. 8 will reduce the bandwidth of each 4 dB attenuator cell 804a-804f, that can be easily compensated for using compensation capacitors, as indicated by the double-prime symbols.

The example shown in FIG. 8 is also useful for illustrating how the stack size of attenuator cells needs to be appropriately sized to handle different maximum incident power levels (Pin). For example, focusing on just the thermometer weighted attenuator cells 804a-804f in FIG. 8, TABLE 5A sets forth the required per cell and total stack size needed as Pin increases, while TABLE 5B shows the per cell voltage across each thermometer weighted attenuator cell 804a-804f for the same Pin levels, in both cases for a particular FET implementation process technology and using the values set forth in TABLES 2 and 3 above. The same principle may apply to the other embodiments in this description.

TABLE 5A

| Stack Size Atten (dB/bit) | 804a 4 | 804b 4 | 804c 4 | 804d 4 | 804e 4 | 804f 4 | Total Stack Size |
|---|---|---|---|---|---|---|---|
| Pin = 30 dBm | 2 | 1 | 1 | 1 | 1 | 1 | 7 |
| Pin = 34 dBm | 2 | 2 | 1 | 1 | 1 | 1 | 8 |
| Pin = 38 dBm | 3 | 2 | 2 | 1 | 1 | 1 | 10 |
| Pin = 42 dBm | 5 | 3 | 2 | 2 | 1 | 1 | 14 |

TABLE 5B

| Volts across bit Atten (dB/bit) | 804a 4 | 804b 4 | 804c 4 | 804d 4 | 804e 4 | 804f 4 |
|---|---|---|---|---|---|---|
| Pin = 30 dBm | 3.69 | 2.33 | 1.47 | 0.93 | 0.58 | 0.37 |
| Pin = 34 dBm | 5.85 | 3.69 | 2.33 | 1.47 | 0.93 | 0.58 |
| Pin = 38 dBm | 9.27 | 5.85 | 3.69 | 2.33 | 1.47 | 0.93 |
| Pin = 42 dBm | 14.69 | 9.27 | 5.85 | 3.69 | 2.33 | 1.47 |

While power handling in a DSA is generally a foremost design concern, the general concept of limiting voltage across FET devices also applies to other design parameters, such as linearity. For example, in the same architecture as the DSA 800, the stack height of attenuator cells seeing a greater voltage across such cells than other attenuator cells may be selectively increased so as to maintain a maximum FET Vds voltage that is less than the Vds_MAX for the FETs, in order to achieve a specified linearity metric (e.g., harmonics, intermodulation distortion). Thus, a fabrication process specification (e.g., Vds_MAX=3.3V) may not be the limiting factor for the per-FET Vds voltage level, which may instead be dependent upon other design parameters. As an example, in modeling a particular embodiment of the DSA 800 to generate the data in TABLES 5A and 5B, the maximum FET device voltage level was set to about 3.3V, as in the previous examples in this description. However, TABLE 5C shows the stack size for the same DSA 800 configuration when the maximum FET device voltage level is set to about 2V for the attenuator cells 804a-804f, a voltage level selected to keep harmonic generation by any attenuator cell in the chain to less than about 95 dBc with respect to the Pin level.

TABLE 5C

| Stack Size Atten (dB/bit) | 804a 4 | 804b 4 | 804c 4 | 804d 4 | 804e 4 | 804f 4 | Total Stack Size |
|---|---|---|---|---|---|---|---|
| Pin = 30 dBm | 2 | 2 | 1 | 1 | 1 | 1 | 8 |
| Pin = 34 dBm | 3 | 2 | 2 | 1 | 1 | 1 | 10 |
| Pin = 38 dBm | 5 | 3 | 2 | 2 | 1 | 1 | 14 |
| Pin = 42 dBm | 8 | 5 | 3 | 2 | 2 | 1 | 21 |

Bidirectional High Power DSA

As described above, the DSA 600 of FIG. 6 and the DSA 800 of FIG. 8 have defined RF IN and RF OUT ports and are not configured to handle bidirectional high power; for example, if the 4 dB attenuator cells 804a-804f are activated in strictly left-to-right order, 30 dBm cannot be applied to the low power RF OUT port in the illustrated configurations, and so high power input is restricted to the RF IN port. However, the attenuator cells of those DSAs 600, 800 can be configured to handle bi-directional high power input by rearranging their order physically and logically.

Figure 9:
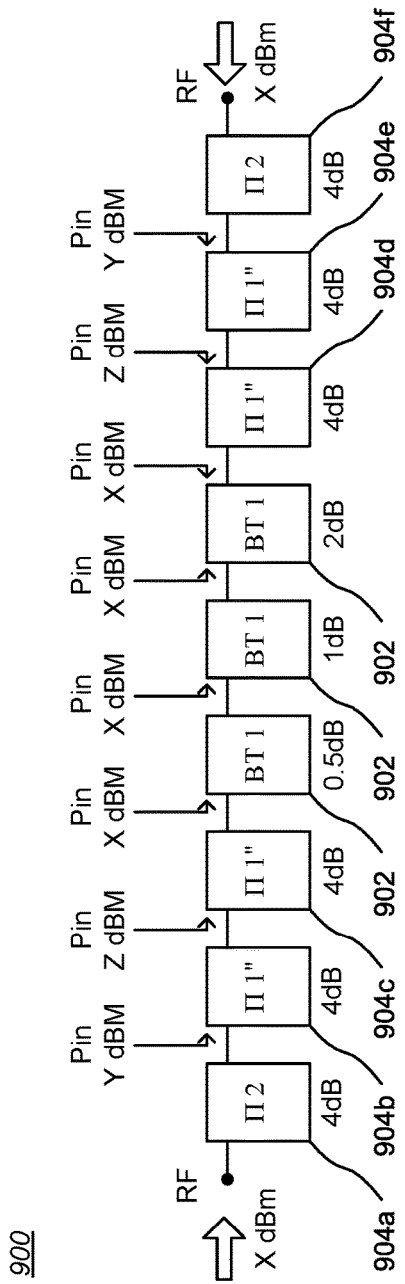
FIG. 9 is a block diagram of one example of a DSA that is a re-arranged version of the DSA of FIG. 8 capable of handling bidirectional high power.

FIG. 9 is a block diagram of one example of a DSA 900 that is a physically re-arranged version of the DSA 800 of FIG. 8 capable of handling bidirectional high power. In the illustrated embodiment, the attenuator cells 902 representing the least significant bits (LSBs) of attenuation are placed among a set of higher attenuation level (4 dB in this case) attenuator cells 904a-904f. Note that while the LSB attenuator cells 902 are shown in the middle of the higher level attenuation cells 904a-904f, the LSB attenuator cells 902 can be placed anywhere in the chain as long as each such cell is designed to withstand the maximum input power (X dBm), since in some states of the DSA 800, only a single LSB attenuator cell 902 may be activated. Further, while the LSB attenuator cells 902 are shown adjacent to each other and in order of increasing attenuation, they may be in any physical order and need not be adjacent.

The attenuator cells 904a-904f are operated with thermometer weighting, but not necessarily in strictly linear (e.g., left to right) order. Accordingly, control lines may need to be remapped to match the physical layout of the attenuator cells 904a-904f. In the illustrated embodiment, the outermost 4 dB attenuator cells 904a, 904f, coupled to respective RF ports at the edges of the DSA 900, have a FET stack size of 2 in order to be able to handle incident input signal power of X=30 dBm when ON (see TABLE 2 and TABLE 3 above;

the notations and arrows above the attenuator cells 902, 904a-904f show the relative maximum power level applied to each such cell). By selectively controlling the order of activation of outer 4 dB attenuator cells so as to precede any inner 4 dB attenuator cells, the interior cells will never see more than Y=26 dBm or Z=22 dBm of incident input power in their ON state using thermometer weighting, for the reasons given above. Accordingly, in the illustrated example, the interior 4 dB attenuator cells 904b-904e can have a FET stack size of one (see TABLE 4 above) and their respective attenuation/matching resistors can be sized to dissipate much lower powers. Each of the attenuator cells 902 representing the least significant bits of attenuation may be subjected to an incident input signal power of X=30 dBm, but only need a FET stack size of one (see TABLE 3 above). The resulting series stack size for the DSA 900 is 11, a significant reduction from the series stack size of 15 for the DSA 700 of FIG. 7 but with the same bidirectional high power handling capability.

Note that while the 4 dB attenuator cells 904a-904f are shown in a left-to-right order, only the outermost "edge" 4 dB attenuator cells 904a and 904f have to withstand the full X=30 dBm. As long as the edge 4 dB attenuator cells 904a and 904f are configured to always turn ON first, then the remaining interior 4 dB attenuator cells 904b-904e will be exposed to lower power levels. Thus, in this example, attenuator cells 904b and 904e will never see more than Y=26 dBm of incident input power in their ON state. Similarly, as long as attenuator cells 904b and 904e are configured to always turn ON first, then the remaining interior 4 dB attenuator cells 904c and 904d will be exposed to even lower power levels. Thus, in this example, attenuator cells 904c and 904d will never see more than Z=22 dBm of incident input power in their ON state. In operation, the sequence of 4 dB attenuator cells 4 dB bits being activated "thermometer style" by control lines would generally alternate from side to side so that the DSA 900 has bidirectional high power handling capability. However, the same DSA 900 configuration may else be operated to have defined RF IN and RF OUT ports by accepting input that selectively determines which port should be considered the "high" voltage Pin port. For example, a user or other circuitry may select left-to-right or right-to-left control bit sequencing of the 4 dB attenuator cells 904a-904f.

As indicated by the double-prime symbols, some of the attenuator cells (e.g., attenuator cells 904b-904e) may include capacitor compensation to maintain a matching bandwidth. The bidirectional DSA 900 of FIG. 9 should have the same bandwidth as the unidirectional DSA 800 of FIG. 8, but will a small increase in IL due to an additional FET device (i.e., a series stack size of 11 versus a series stack size of 10).

Figure 10:
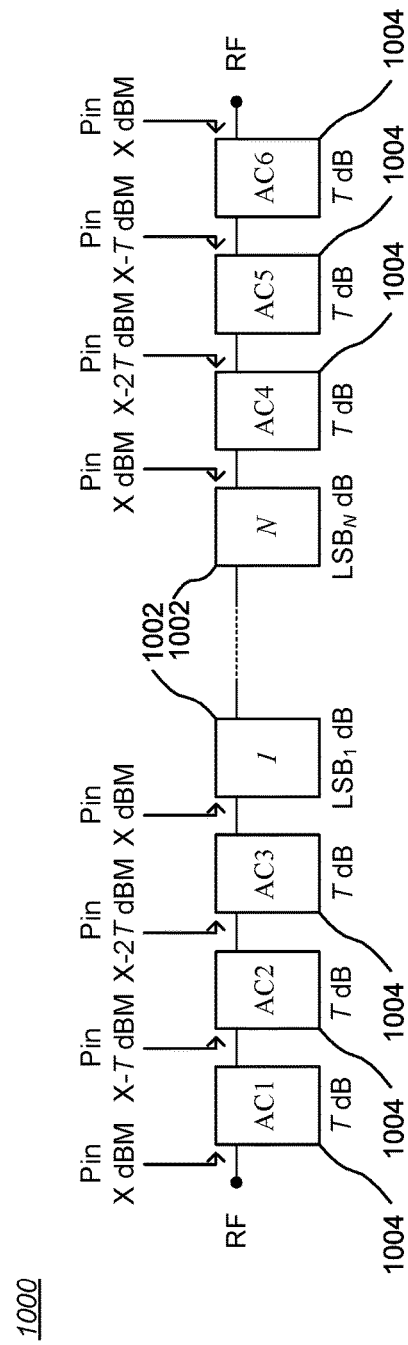
FIG. 10 is a block diagram of a generalized DSA capable of handling bidirectional high power with a low series stack size.

FIG. 10 is a block diagram of a generalized DSA 1000 capable of handling bidirectional high power with a low series stack size. This generalized implementation of a partly binary/partly thermometer weighted DSA may be used at the same input power level in either a unidirectional or bidirectional mode. In the illustrated embodiment, the DSA 1000 includes a set of N binary-weighted attenuator cells 1002 (e.g., N=3, 0.5 dB, 1 dB, 2 dB) and a set of M thermometer-weighted attenuator cells 1004 of T dB attenuation each (e.g., M=6 at 4 dB each). In this example, the incident input power at either RF port is X dBm (e.g., 30 dBm). For ease of explanation, the following discussion will assume only 6 thermometer-weighted attenuator cells 1004, labelled AC1-AC6, but the principles apply to other numbers of thermometer-weighted attenuator cells.

The series stack size of each of the set of N binary-weighted attenuator cells 1002 should be set so as to enable such attenuator cells 1002 to withstand the full input power of X dBm when none of the thermometer-weighted attenuator cells 1004 are in an ON state. Examples of appropriate stack sizes for a particular fabrication technology are set forth in TABLE 3.

The sequence in which the thermometer-weighted attenuator cells 1004 will be turned ON is selected in such a way that the bracketing edge attenuator cells AC1 and AC6 are the only thermometer-weighted attenuator cells 1004 that will be subjected to the full X dBm of power incident. A minimum series FET stack size F1 for attenuator cells AC1 and AC6 has to be chosen such that the voltage across these attenuator cells does not cause breakdown in the FET stack or cause compression. (Note that, for the sake of simplicity, it is assumed that the W/L sizing of the FETs for the DSA 1000 of FIG. 10 is the same regardless of the stack size or the attenuator cell in which such FETs are being used.) Examples of appropriate stack sizes for a particular fabrication technology and particular values of T are set forth in TABLE 3.

The series stack size F1 of the attenuator cells AC1, AC6 along with the W/L sizing of their FET determines the bandwidth the attenuator cells AC1, AC6 can provide. Corresponding compensation capacitors $C_N$ may be used in these attenuator cells to extend their bandwidth. As discussed above, each attenuator cell 1002, 1004 in the DSA 1000 ideally should have the same bandwidth.

The interior attenuator cells AC2 and AC5 only have to withstand an incident power of (X dBm−T dB) when in an ON state because they are only turned ON after attenuator cells AC1, AC6 are in an ON state. Since the incident power to attenuator cells AC2, AC5 is T dB lower because of the attenuation provided by attenuator cells AC1, AC6, the voltage drop across attenuator cells AC2, AC5 will also be lower. Accordingly, the series stack size for attenuator cells AC2, AC5 can be reduced based upon the actual maximum voltage drop across those cells. In general, a minimum stack size of F2 may be selected for attenuator cells AC2, AC5 such that F2≤F1. Again, examples of appropriate stack sizes for a particular fabrication technology and particular values of T are set forth in TABLE 3.

The same concept applies to the most interior attenuator cells AC3 and AC4, which will each only have to withstand (X dBm−2×T dB) of incident power when in an ON state, because they are only turned ON after bracketing attenuator cells AC1, AC2, AC5, and AC6 are in an ON state. In general, a minimum stack size of F3 may be chosen for attenuator cells AC3, AC4 such that F3≤F2≤F1. For example, if F1=2, F2 and F3 may each be 1. The total minimum series stack size for the DSA 1000 will be equal to: F1+F2+F3+{the total series stack size of the LSB attenuator cells}.

If the minimum series stack size for the attenuator cells AC2, AC5 is smaller than for the attenuator cells AC1, AC6, the bandwidth of the DSA 1000 will be reduced as well. More particularly, since this example has assumed that the W/L size of each FET used in the DSA 1000 is the same, the equivalent $C_{OFF}$ of the F2 stack will be higher than the $C_{OFF}$ of the F1 stack, thereby reducing the bandwidth of the attenuator cells AC2, AC5. The bandwidth of the attenuator cells AC2, AC5 can be adjusted back to match the bandwidth of the attenuator cells AC1, AC6 by adding corresponding compensation capacitors $C_M$ and setting the value of those compensation capacitors to a suitable value (typically, $C_M > C_N$). The same concept applies to the attenuator cells AC3, AC4, which may have even lower bandwidth; accordingly, corresponding compensation capacitors $C_L$ may be added, set to a suitable value (typically, $C_L > C_M > C_N$). In all such cases, suitable values for the compensation capacitors can be determined by circuit modeling and simulation, computation, or measurement of actual test circuits across a range of values.

Accordingly, lower-power thermometer-weighted attenuator cells (i.e., cells not capable of withstanding the maximum incident power) are physically and logically configured to ensure that they cannot be activated (i.e., set to an ON state) until after activation of at least two other bracketing (i.e., more exterior) higher-power thermometer-weighted attenuator cell capable of withstanding the maximum incident power and collectively providing sufficient attenuation to lower the incident power to the lower-power thermometer-weighted attenuator cells to a level that can be withstood by such cells. In the most general case, the power handling capability of a first attenuator cell can be lowered, compared to the power handling capability of a second attenuator cell, by approximately the attenuation level provide by the second attenuator cell.

Multi-State Attenuator Cells

Each of the attenuator cells in the above examples provide only one level of attenuation when in the ON attenuation state, and no attenuation when in the OFF bypass state. It may be beneficial in some applications to use a multi-state attenuator circuit for one or more attenuator cells in a DSA configured in accordance with the above teachings.

U.S. patent application Ser. No. 14/878,750 referenced above (the "Multi-State Attenuator Application"), describes a number of multi-state attenuator circuits suitable for use in embodiments of the present invention. More particularly, the Multi-State Attenuator Application teaches RF attenuator configurations that include bridged-T type, pi-type, T-type, and/or L-pad type structures each having a programmable throughput section with at least two selectable attenuation levels, and a coupled programmable impedance matching shunt section. The throughput sections and shunt sections may be configured in various combinations of parallel and serial fixed or selectable resistance elements such that multiple attenuation states and impedance matching states can be programmatically selected, and may include stacked FET switch elements to withstand applied voltages to a specified design level. As set forth in the Multi-State Attenuator Application, such a multi-state attenuator can be represented symbolically by a block indicating the attenuator type (e.g., "BT", for "bridged-T", or "H" for "pi-type"), the minimum series stack size (e.g., "1" or "3"), and the number of attenuation (resistance) states (e.g., "2R" or "3R").

Figure 11:
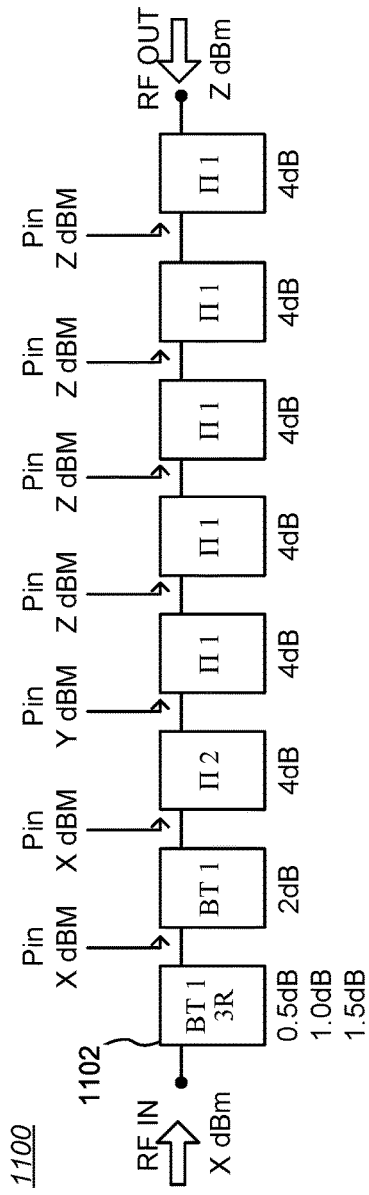
FIG. 11 is a block diagram of an example DSA having a single multi-state attenuator cell that replaces two attenuator cells having only a single level of attenuation.

An important aspect of the particular multi-state attenuator circuits disclosed in the Multi-State Attenuator Application is that they provide a reduced series stack size compared to series-connected attenuator cells providing the same levels of attenuation. For example, FIG. 11 is a block diagram of an example DSA 1100 having a single multi-state attenuator cell 1102 that replaces two attenuator cells having only a single level of attenuation. More particularly, the DSA 1100 of FIG. 11 is a variant of the DSA 800 of FIG. 8 in which the 0.5 dB and 1 dB single-valued attenuator cells of FIG. 8 (total series stack size of 2) have been replaced by a bridged-T type multi-state attenuator 1102 that provides three selectable levels of attenuation (0.5 dB, 1.0 dB, and 1.5 dB in this case, but other values may be used) and has a total series stack size of 1 regardless of the selected level of attenuation. One assumption made for this embodiment is that power is applied only at the RF IN port, which makes this DSA 1100 unidirectional.

The DSA 1100 of FIG. 11 thus provides for a lower series stack size of 9 (versus 10 for the DSA 800 of FIG. 8) with the added flexibility of an additional attenuation increment (1.5 dB) not provided by the DSA 800 of FIG. 8. The bandwidth of the DSA 1100 should be about same as the bandwidth of the DSA 800 in FIG. 8 as long as the parasitic effects of the additional FET switches are taken into account. Accordingly, using a multi-state attenuator not only helps eliminate one extra attenuator cell but reduces the IL of the DSA 1100 with little effect on bandwidth.

Figure 12:
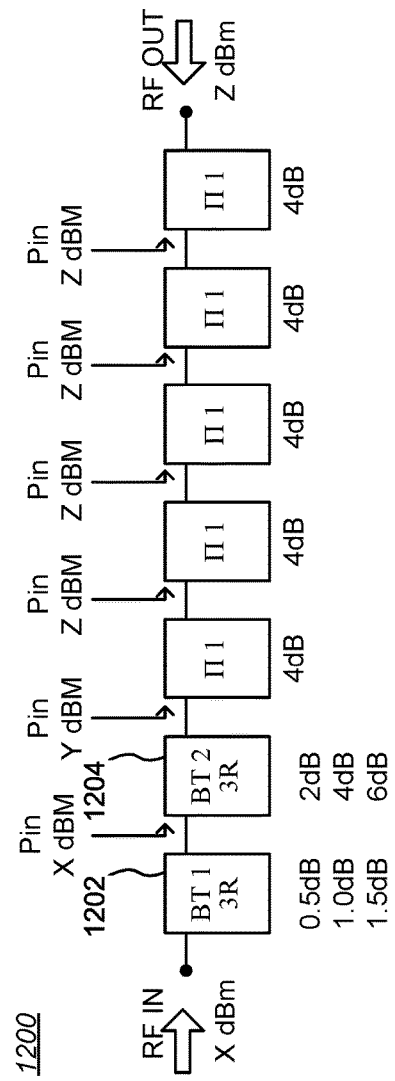
FIG. 12 is a block diagram of an example DSA having multiple multi-state attenuator cells in place of attenuator cells having only a single level of attenuation.

FIG. 12 is a block diagram of an example DSA 1200 having multiple multi-state attenuator cells 1202, 1204 in place of attenuator cells having only a single level of attenuation. More particularly, the DSA 1200 of FIG. 12 is a variant of the DSA 800 of FIG. 8 in which (A) the 0.5 dB and 1 dB attenuator cells of FIG. 8 (total series stack size of 2) have been replaced by a bridged-T type multi-state attenuator 1202 (total series stack size of 1) that provides three selectable levels of attenuation (0.5 dB, 1.0 dB, and 1.5 dB), and (B) the 2.0 dB and first 4 dB attenuator cells of FIG. 8 (total series stack size of 3) have been replaced by a bridged-T type multi-state attenuator 1204 (total series stack size of 2) that provides three selectable levels of attenuation (2 dB, 4 dB, and 6 dB). The bridged-T type multi-state attenuators 1202, 1204 are preferably of the type taught in the Multi-State Attenuator Application. One assumption made for this embodiment is that power is applied only at the RF IN port, which makes this DSA 1200 unidirectional.

The DSA 1200 of FIG. 12 provides for a lower series stack size of 8 (versus 10 for the DSA 800 of FIGS. 8 and 9 for the DSA 1100 of FIG. 11) with the added flexibility of additional attenuation increments (1.5 dB and 6 dB) not provided by the DSA 800 of FIG. 8. The bandwidth of the DSA 1200 should be about same as the bandwidth of the DSA 800 in FIG. 8 as long as the parasitic effects of the additional FET switches are taken into account (e.g., by using compensation capacitors). Accordingly, using multiple multi-state attenuators not only helps eliminate extra attenuator cells but reduces the IL of the DSA 1200 with little effect on bandwidth.

As described above, the DSA 1100 of FIG. 11 and the DSA 1200 of FIG. 12 have defined RF IN and RF OUT ports and are not configured to handle bidirectional high power; for example, 30 dBm cannot be applied to the low power RF OUT port in the illustrated configurations, and so high power input is restricted to the RF IN port. However, by physically and logically rearranging the attenuator cells of those DSAs 1100, 1200, they can be configured to handle bi-directional high power input. FIG. 13 is a block diagram of one example of a DSA 1300 that is a re-arranged variant of the DSA 900 of FIG. 9 capable of handling bidirectional high power. In the illustrated embodiment, a multi-state attenuator cell 1302 that provides three selectable levels of attenuation (0.5 dB, 1.0 dB, and 1.5 dB) representing the least significant bits of attenuation is placed among a set of higher attenuation level (4 dB in this case) attenuator cells 1304a-1304e. The 4 dB attenuator cells 1304a-1304e generally would be operated with thermometer weighting, remapping control lines as needed to match the re-arranged physical and logical layout. In addition, in this particular embodiment, a second multi-state attenuator cell 1306 providing three selectable levels of attenuation (2 dB, 4 dB, and 6 dB) is placed at one end of the DSA 1300 in place of a single-level 4 dB attenuator cell.

In the illustrated embodiment, the 4 dB attenuator cell 1304a and the multi-state attenuator cell 1306, coupled to respective RF ports at the edges of the DSA 1300, have a FET stack size of 2 to withstand an incident input signal power of X=30 dBm (see TABLE 2 and TABLE 3 above). The remaining 4 dB attenuator cells 1304b-1304e will never see more than Y=26 dBm or Z=22 dBm of incident input power in their ON state using thermometer weighting, for the reasons given above. Accordingly, these "guarded" 4 dB attenuator cells 1304b-1304e can have a FET stack size of one (see TABLE 4 above). The multi-state attenuator cell 1302 representing the least significant bits of attenuation may be subjected to an incident input signal power of X=30 dBm, but only need a FET stack size of one (see TABLE 3 above). The resulting series stack size for the DSA 1300 is 9, a significant reduction from the series stack size of 11 for the DSA 900 of FIG. 9 but with the same bidirectional high power handling capability. This DSA 1300 should have approximately the same bandwidth as the DSA 900 of FIG. 9, but with a decrease in IL due to the elimination of two series FETs.

FIG. 14 is a block diagram of a unidirectional DSA 1400 variant using multiple multi-state attenuator cells 1402, 1404. While somewhat similar to the DSA 1200 of FIG. 12, the five 4 dB attenuator cells of DSA 1200 have been replaced by three 8 dB attenuator cells 1406a-1406c (in both cases, using thermometer weighting), incidentally providing a higher maximum attenuation for the DSA (by an extra 4 dB). Assuming an incident input power level of 30 dBm, the first 8 dB attenuator cell 1406a will have to withstand the full 30 dBm of incident power and thus requires a suitable series FET stack size (3 FETs, in this example). The other two 8 dB attenuator cells 1406b, 1406c only have to withstand 22 dBm of input power (i.e., 30 dBm-8 dB from attenuator cell 1406a) at most, and hence a single FET is sufficient for that power level. The resulting series stack size for the DSA 1400 is 8. The single series FET 8 dB attenuator cells 1406b, 1406c will experience some reduction in bandwidth, but capacitor compensation (not shown) can extend their bandwidth to match the bandwidth of the first 8 dB attenuator cell 1406a (but with some degradation in return loss).

Figure 15:
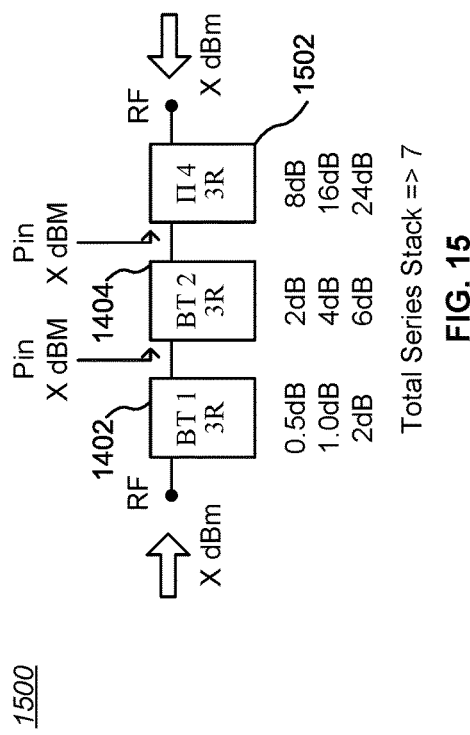
FIG. 15 is a block diagram of a bidirectional DSA variant using only multi-state attenuator cells.

FIG. 15 is a block diagram of a bidirectional DSA 1500 variant using only multi-state attenuator cells 1402, 1404, 1502. While somewhat similar to the DSA 1400 of FIG. 14, the three thermometer-weighted 8 dB attenuator cells 1406a-1406c of the DSA 1400 have been replaced by a single binary-weighted multi-state pi-type attenuator cell 1502. Assuming an incident input power level of 30 dBm, the multi-state pi-type attenuator cell 1502 has to withstand the full 30 dBm of incident power, and accordingly a series stack size of 4 was selected, which is required for the 24 dB attenuation state under these assumptions (see TABLE 7 in the Multi-State Attenuator Application). The 24 dB state determines the bandwidth of the DSA. As noted above, higher attenuation states tend to have the least bandwidth, and thus very large compensation capacitors (not shown) may be required to provide a higher bandwidth for the multi-state pi-type attenuator cell 1502.

The resulting series stack size for the DSA 1500 is 7, which will result in the least IL as compared to all of the other embodiments described in this application. Assuming a 0.1 dB IL per FET serial switch at about 4 GHz, this DSA 1500 can have a total IL of about 0.7 dB at about 4 GHz.

Figure 16:
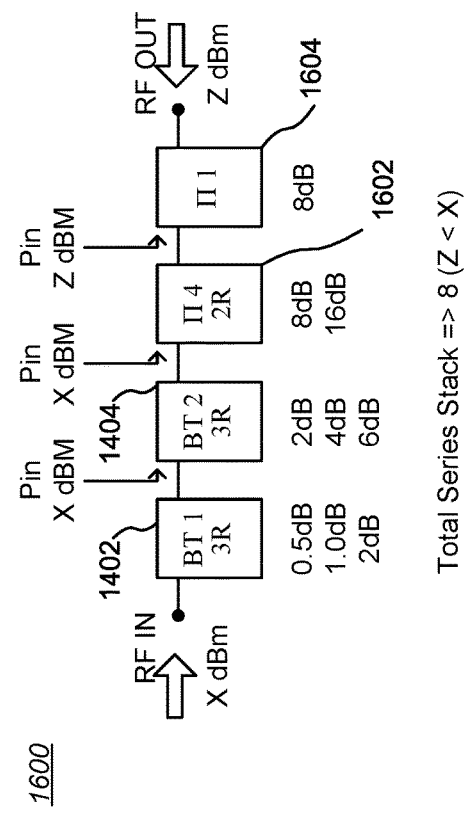
FIG. 16 is a block diagram of a unidirectional DSA variant using mostly multi-state attenuator cells in conjunction with a single state attenuator cell.

FIG. 16 is a block diagram of a unidirectional DSA 1600 variant using mostly multi-state attenuator cells 1402, 1404, 1602 in conjunction with a single-state attenuator cell 1604.

While somewhat similar to the DSA 1500 of FIG. 15, the single three-state pi-type attenuator cell 1502 (8 dB, 16 dB, 24 dB) of the DSA 1500 has been replaced by a two-state multi-state attenuator cell 1602 (8 dB, 16 dB) and a thermometer-weighted single-state 8 dB attenuator cell 1604 configured to only be activated (turned ON) after one of the attenuation states of the two-state multi-state attenuator cell 1602 is activated (turned ON). This replacement improves the bandwidth of the DSA 1600 by eliminating the bandwidth-reducing 24 dB attenuator state from the DSA 1500 of FIG. 15 while preserving the ability to select 24 dB of attenuation by activating the 16 dB attenuation path of attenuator cell 1602 plus 8 dB of attenuation from attenuator cell 1604. The resulting series stack size for the DSA 1600 is 8; accordingly, the DSA 1600 will have less IL than a conventional DSA.

In the illustrated embodiment, if a maximum input signal power of 30 dBm is applied only to the RF IN port, the single-state 8 dB attenuator cell 1604 will only have to withstand 14 dBm of incident power at most (i.e., 30 dBm-8 dB from attenuator cell 1602). Such an input configuration may be used to not only reduce the series stack size of the single-state 8 dB attenuator cell 1604 to a single FET, but also reduce the sizing of the attenuation resistors internal to the cell, which will in turn reduce parasitic elements (e.g., parasitic capacitances and inductances).

If designed carefully, including modeling all of the parasitic elements, a wider bandwidth can be achieved for the DSA 1600 of FIG. 16 than for the DSA 1500 of FIG. 15. The only cost is an increase in IL by a small amount due to the extra FET series switch. If the IL of a single FET serial switch is 0.1 dB at about 4 GHz, then the total IL for the DSA 1600 will be 0.8 dB at about 4 GHz, which is still less than 1 dB (a good figure of merit for DSAs).

While the Multi-State Attenuator Application teaches a variety of circuits that are useful in embodiments of the present invention, other multi-state attenuator circuits may also be used in embodiments of the present invention.

Methods

Another aspect of the invention includes a method for selectively attenuating radio frequency (RF) signals, including providing a first signal port for receiving the applied signal, and a second signal port for conveying the applied signal; providing a plurality of binary-weighted selectable attenuator cells serially coupled between the first and second signal ports, each binary-weighted attenuator cell providing a bypass state and at least one selectable attenuation state and having a series stack; providing a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a series stack; setting the size of the series stack of at least one of the thermometer-weighted selectable attenuator cells to a size sufficient to withstanding the maximum power level of the applied signal; and setting the size of the series stack of the remaining thermometer-weighted selectable attenuator cells to a smaller size sufficient to withstand only less than the maximum power level of the applied signal.

A further aspect of the invention includes a method for selectively attenuating radio frequency (RF) signals, including providing a first signal port and a second signal port; providing a plurality of binary-weighted selectable attenuator cells serially coupled between the first and second signal ports, each binary-weighted attenuator cell providing a bypass state and at least one selectable attenuation state and having a series stack; providing a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a series stack; setting the size of the series stack of at least one of the thermometer-weighted selectable attenuator cells adjacent to each of the first signal port and the second signal port to a size sufficient to withstanding the maximum power level of the applied signal and attenuate the maximum power level to a lower power level; setting the size of the series stack of the remaining thermometer-weighted selectable attenuator cells to a smaller size sufficient to withstand only the lower power level; and configuring and controlling the plurality of thermometer-weighted selectable attenuator cells such that the attenuator cells having a smaller series stack size cannot be set to an attenuation state until after at least one of the attenuator cells adjacent to each of the first signal port and the second signal port and having a series stack size sufficient to withstand the maximum power level of the applied signal is set to an attenuation state.

Still another aspect of the invention includes a method for selectively attenuating radio frequency (RF) signals, including providing a first signal port and a second signal port; and providing a plurality of binary-weighted selectable multi-state attenuator cells serially coupled between the first and second signal ports, each binary-weighted multi-state attenuator cell providing a bypass state and at least two selectable attenuation states and having a series stack.

A further aspect of the invention includes a method for modifying an electronic digital step attenuator circuit for selectively attenuating an applied signal, the digital step attenuator circuit including a plurality of attenuator cells serially coupled between first and second signal ports, each attenuator cell providing a bypass state and at least one selectable attenuation state and having a series stack, including the steps of replacing at least one attenuator cell providing high attenuation with a set of two or more attenuator cells each providing lower attenuation, the set of two or more replacement attenuator cells having approximately the same total attenuation as the replaced at least one attenuator cell, but a lower total series stack size than the replaced at least one attenuator cell; and operating the set of two or more replacement attenuator cells with thermometer weighting such that increasing attenuation levels are achieved by progressively switching successive replacement attenuator cells into circuit and decreasing attenuation levels are achieved by progressively switching successive replacement attenuator cells out of circuit.

Glitch Reduction

DSAs of the type described above are also useful in reducing signal transients ("glitches") that may occur between state transitions. A glitch is an intermediate state a DSA encounters when it switches a few LSBs attenuator cells OFF and turns ON the next most significant bit (MSB) attenuator cell. For example, when a conventional 5-bit binary-weighted DSA with 0.5 dB steps switches from a 7.5 dB state to an 8.0 dB state, the LSBs 0.5 dB, 1.0 dB, 2.0 dB and 4 dB attenuator cells are turned OFF and the next MSB 8 dB attenuator cell is turned ON; thus, the DSA switches from binary code "01111" to binary code "10000". The sudden switching of 7.5 dB of attenuation out of circuit, and the sudden switching of 8.0 dB of attenuation into circuit, results in an electrical signal glitch.

DSA embodiments in accordance with the invention significantly reduce the amplitude of switching glitches by replacing the binary-weighted cascade of attenuators of prior art DSA designs with a segmented DSA architecture that combines binary and thermometer weighted stages. The segmented DSA architecture mitigates transient glitches by reducing the number of attenuator cells toggled during a code transition. In essence, attenuator cells (particularly the thermometer-weighted attenuator cells) are activated in a sequence that reduces signal transients in the applied signal when activating different selectable attenuation states. Further details of such a configuration are set forth in U.S. patent application Ser. No. 14/084,439 referenced above.

DSA Architecture and Design Technique

Aspects and advantages of the DSA architecture and design techniques described in this application include (without limitation):

a reduction in the size of the attenuation resistors per attenuator cell, thus reducing IC die area and parasitic elements;

a reduction in the series FET stack size of some of the attenuator cell configurations (particularly the thermometer encoded sections) by replacing a higher attenuation cell with two or more lower attenuation cells, which can reduce IC die area, improve IL, and maintain matching bandwidth characteristics;

a reduction in the series FET stack size of some of the attenuator cell configurations by using a unidirectional input power configuration;

a reduction in the width/length (W/L) ratio of the series FET(s) in some attenuator cell configurations, thus reducing series FET stack size and hence IC die area while maintaining matching bandwidth characteristics;

a reduction in IL due to reduction in series FET stack size of one or more attenuator cells compared to conventional DSA circuits;

the ability to use smaller attenuator cell values (e.g., 8 dB or 4 dB or lower) to significantly improve the bandwidth of a DSA;

use of one or more multi-state attenuator cells to reduce the total series stack size of a DSA;

use of capacitor compensation in attenuator cells to achieve matching bandwidth characteristics;

the ability to withstand bidirectional high input power without increasing IL by ensuring that one or more lower-power thermometer-weighted attenuator cells (i.e., cells not capable of withstanding the maximum incident power) cannot be activated (i.e., set to an ON state) until after activation of at least one higher-power thermometer-weighted attenuator cell capable of withstanding the maximum incident power and collectively providing sufficient attenuation to lower the incident power to the lower-power thermometer-weighted attenuator cells to a level that can be withstood by such cells; and reducing signal transients (glitches) that may occur between state transitions by using, at least in part, a thermometer-weighted configuration of attenuator cells.

Calibration and Configuration

Each FET switch in the illustrated examples includes an associated control line (not shown) that enables setting the switch to an ON (or CLOSED) conductive state or to an OFF (or OPEN) non-conductive or blocking state, and thus behaves as a single-pole, single-throw switch (stacks of FET switches may be controlled by a common control line signal so as to switch ON or OFF concurrently, and thus the stack behaves like a single switch). Each control line would be coupled to other circuitry (not shown), which may be internal or external; for example, control signals may be provided to the switch control lines through the well-known interfaces specified by the MIPI (Mobile Industry Processor Interface) Alliance, or through the well-known Serial Peripheral Interface (SPI) bus, or by direct control signal pins or lines, or by any other convenient means. Applied control signals may be directly coupled to associated FET switches, or be processed through combinatorial logic circuitry or a mapping circuit (e.g., a lookup table) before being coupled to associated FET switches.

Each DSA embodiment may be tested and characterized by conventional testing means used for attenuators (particularly digital step attenuators), and packaged in a manner suitable for RF circuits, either alone or as part of a larger circuit or system.

Characterization of a DSA may be performed by comparing each DSA attenuation state with a reference state (i.e., the state of the DSA with no intentional attenuation selected). The loss in each attenuation state minus the loss in the reference state is the actual attenuation for the selected state. Calibration of a DSA may be performed by mapping one or more attenuator cells to best match a desired level. For example, if a selected attenuator cell or set of attenuator cells is supposed to provide, for example, 16 dB of attenuation, due to process variations and other factors the actual amount of attenuation provided may only be 15.3 dB. Accordingly, it may be necessary to add in a small amount of attenuation (e.g., 0.5 dB or 1 dB) by concurrently activating other attenuator cells whenever a nominal 16 dB of attenuation is selected.

At the time of manufacture or after testing by a manufacturer or user, the particular attenuation state of a DSA may be configured in various ways to set a fixed attenuation level, such as by application of one or more mask layers or "blowing" fusible links. More flexibly, the particular attenuation state of a DSA may be configured under program control in order to dynamically set attenuation levels, such as by the use of look-up tables external or internal to an IC that includes the DSA. In the latter case, a lookup table can be prepared—typically as part of the calibration process—with switch control data that maps each desired attenuation state (e.g., a binary number from 0-31) to a physical state of the attenuator cell switches (i.e., ON and OFF switch states) which corresponds to the physical circuit status of the DSA (i.e., the number of in-circuit attenuator elements required to provide a selected level of attenuation).

Program control of a DSA attenuation state can be based on a user selection or external control signal, directly or indirectly (e.g., a selected frequency band may by mapped to a specific attenuation state), or be automatically set in response to detected states or parameters (e.g., detected signal frequency, signal strength, power consumption, IC device temperature, etc.).

Uses

DSAs are useful in a wide variety of circuits for performing a range of functions, including (but not limited to) impedance matching circuits, power amplifiers (e.g., scalable periphery tunable matching power amplifiers, and Doherty amplifiers), phase shifters, RF switches, etc. Such functions are particularly useful in such applications as radar systems (including phased array and automotive radar systems), and radio systems. Radio system usage includes (again, without limitation) cellular radios systems (including base stations, relay stations, and hand-held transceivers) that use such standards as Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution ("EDGE"), Long Term Evolution ("LTE"), as well as other radio communication standards and protocols.

Alternative Embodiments, Options, and Fabrication Technologies

While the examples described above have used a combination of bypassable bridged-T type and pi-type attenuator cells, the concepts also apply to DSAs that include bypassable attenuator cells (including multi-state attenuator cells) based on bridged-T type, pi-type, T-type, and/or L-Pad type attenuator circuits, alone or in combination.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. An electronic digital step attenuator circuit for selectively attenuating an applied signal, including:
   (a) a first signal port for receiving the applied signal, and a second signal port for conveying the applied signal;
   (b) a plurality of binary-weighted selectable attenuator cells serially coupled between the first and second signal ports, each binary-weighted attenuator cell providing a bypass state and at least one selectable attenuation state and having a stack of series-connected field effect transistors (FETs) having a series stack size equal to a count of the series-connected FETs of the binary-weighted attenuator cell; and
   (c) a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a stack of series-connected FETs having a series stack size equal to a count of the series-connected FETs of the thermometer-weighted attenuator cell;
   wherein the series stack size of at least one of the thermometer-weighted selectable attenuator cells is configured to withstand a maximum power level of the applied signal, and remaining thermometer-weighted selectable attenuator cells include smaller series stack sizes configured to withstand only an attenuated signal having a power level less than the maximum power level of the applied signal, wherein a total of the series stack sizes of the thermometer-weighted selectable attenuator cells is configured to reduce an overall insertion loss for the electronic digital step attenuator circuit.

2. The electronic digital step attenuator circuit of claim 1, wherein the applied signal is a radio frequency signal.

3. The electronic digital step attenuator circuit of claim 1, wherein the digital step attenuator circuit has a total minimum series stack size of 10.

4. The electronic digital step attenuator circuit of claim 1, wherein the maximum applied signal has a power level of about 30 dBm.

5. The electronic digital step attenuator circuit of claim 1, wherein each thermometer-weighted selectable attenuator cell provides no more than about 8 dB of attenuation.

6. The electronic digital step attenuator circuit of claim 1, wherein each thermometer-weighted selectable attenuator cell provides no more than about 4 dB of attenuation.

7. The electronic digital step attenuator circuit of claim 1, wherein the plurality of thermometer-weighted selectable attenuator cells are activated in a sequence that reduces signal transients in the applied signal when activating different selectable attenuation states.

8. The electronic digital step attenuator circuit of claim 1, wherein at least one selectable attenuator cell includes capacitor compensation to adjust the bandwidth of such cell.

9. The electronic digital step attenuator circuit of claim 1, wherein at least one selectable attenuator cell is a multi-state attenuator cell.

10. The electronic digital step attenuator circuit of claim 9, wherein the digital step attenuator circuit has a total minimum series stack size of 9.

11. The electronic digital step attenuator circuit of claim 9, wherein the digital step attenuator circuit has a total minimum series stack size of 8.

12. The electronic digital step attenuator circuit of claim 9, wherein each thermometer-weighted selectable attenuator cell provides no more than about 8 dB of attenuation and wherein the digital step attenuator circuit has a total minimum series stack size of 8.

13. An electronic digital step attenuator circuit for selectively attenuating an applied signal, including:
   (a) a first signal port and a second signal port;
   (b) a plurality of binary-weighted selectable attenuator cells serially coupled between the first and second signal ports, each binary-weighted attenuator cell providing a bypass state and at least one selectable attenuation state and having a stack of series-connected field effect transistors (FETs) having a series stack size equal to a count of the series-connected FETs of the binary-weighted attenuator cell; and
   (c) a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a stack of series-connected FETs having a series stack size equal to a count of the series-connected FETs of the thermometer-weighted attenuator cell;
   wherein the series stack size of at least one of the thermometer-weighted selectable attenuator cells adjacent to each of the first signal port and the second signal port is a higher power attenuator cell configured to withstand a maximum power level of the applied signal and attenuate the maximum power level of the applied signal to a lower power level;
   wherein remaining thermometer-weighted selectable attenuator cells each include a lower power attenuator cell of a smaller size configured to withstand only the lower power level; and
   wherein the digital step attenuator circuit is further configured and controlled such that the lower power attenuator cells cannot be set to an attenuation state until after at least one of the higher power attenuator cells adjacent to each of the first signal port and the second signal port is set to an attenuation state.

14. The electronic digital step attenuator circuit of claim 13, wherein the applied signal is a radio frequency signal.

15. The electronic digital step attenuator circuit of claim 13, wherein the digital step attenuator circuit has a total minimum series stack size of 11.

16. The electronic digital step attenuator circuit of claim 13, wherein the maximum applied signal has a power level of at least about 30 dBm.

17. The electronic digital step attenuator circuit of claim 13, wherein each thermometer-weighted selectable attenuator cell provides no more than about 8 dB of attenuation.

18. The electronic digital step attenuator circuit of claim 13, wherein each thermometer-weighted selectable attenuator cell provides no more than about 4 dB of attenuation.

19. The electronic digital step attenuator circuit of claim 13, wherein the plurality of thermometer-weighted selectable attenuator cells are activated in a sequence that reduces signal transients in the applied signal when activating different selectable attenuation states.

20. The electronic digital step attenuator circuit of claim 13, wherein at least one selectable attenuator cell includes capacitor compensation to adjust the bandwidth of such cell.

21. The electronic digital step attenuator circuit of claim 13, wherein at least one selectable attenuator cell is a multi-state attenuator cell.

22. The electronic digital step attenuator circuit of claim 21, wherein the digital step attenuator circuit has a total minimum series stack size of 9.

23. The electronic digital step attenuator circuit of claim 22, wherein each thermometer-weighted selectable attenuator cell provides no more than about 4 dB of attenuation.

24. A method for selectively attenuating radio frequency (RF) signals, including:
(a) providing a first signal port for receiving the applied signal, and a second signal port for conveying the applied signal;
(b) providing a plurality of binary-weighted selectable attenuator cells serially coupled between the first and second signal ports, each binary-weighted attenuator cell providing a bypass state and at least one selectable attenuation state and having a stack of series-connected field effect transistors (FETs) having a series stack size equal to a count of the series-connected FETs of the binary-weighted attenuator cell;
(c) providing a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a stack of series-connected FETs having a series stack size equal to a count of the series-connected FETs of the thermometer-weighted attenuator cell;
(d) selecting the series stack size of the series stack of at least one of the thermometer-weighted selectable attenuator cells to be a size configured to withstand a maximum power level of the applied signal; and
(e) selecting the series stack size of the series stack of remaining thermometer-weighted selectable attenuator cells to be a smaller size configured to withstand only a power level less than the maximum power level of the applied signal.

25. The method of claim 24, wherein the applied signal is a radio frequency signal.

26. The method of claim 24, wherein the total minimum series stack size of the plurality of binary-weighted selectable attenuator cells and the plurality of thermometer-weighted selectable attenuator cells is 10.

27. The method of claim 24, wherein the maximum applied signal has a power level of at least about 30 dBm.

28. The method of claim 24, wherein each thermometer-weighted selectable attenuator cell provides no more than about 8 dB of attenuation.

29. The method of claim 24, wherein each thermometer-weighted selectable attenuator cell provides no more than about 4 dB of attenuation.

30. The method of claim 24, further including activating the plurality of thermometer-weighted selectable attenuator cells in a sequence that reduces signal transients in the applied signal when activating different selectable attenuation states.

31. The method of claim 24, further including adding capacitor compensation to at least one selectable attenuator cell to adjust the bandwidth of such cell.

32. The method of claim 24, wherein at least one selectable attenuator cell is a multistate attenuator cell.

33. The method of claim 32, wherein the total minimum series stack size of the plurality of binary-weighted selectable attenuator cells and the plurality of thermometer-weighted selectable attenuator cells is 9.

34. The method of claim 24, wherein the total minimum series stack size of the plurality of binary-weighted selectable attenuator cells and the plurality of thermometer-weighted selectable attenuator cells is 8.

35. The method of claim 24, wherein each thermometer-weighted selectable attenuator cell provides no more than about 8 dB of attenuation and wherein the total minimum series stack size of the plurality of binary-weighted selectable attenuator cells and the plurality of thermometer-weighted selectable attenuator cells is 8.

36. A method for selectively attenuating radio frequency (RF) signals, including:
(a) providing a first signal port and a second signal port;
(b) providing a plurality of binary-weighted selectable attenuator cells serially coupled between the first and second signal ports, each binary-weighted attenuator cell providing a bypass state and at least one selectable attenuation state and having a stack of series-connected field effect transistors (FETs) having a series stack size equal to a count of the series-connected FETs of the binary-weighted attenuator cell;
(c) providing a plurality of thermometer-weighted selectable attenuator cells serially coupled between the first and second signal ports and serially coupled to the plurality of binary-weighted attenuator cells, each thermometer-weighted attenuator cell providing a bypass state and at least one selectable attenuation state and having a stack of series-connected FETs having a series stack size equal to a count of the series-connected FETs of the thermometer-weighted attenuator cell;
(d) selecting the series stack size of the series stack of at least one of the thermometer-weighted selectable attenuator cells adjacent to each of the first signal port and the second signal port to be a size configured to withstand a maximum power level of the applied signal and attenuate the maximum power level of the applied signal to a lower power level;
(e) selecting the series stack size of the series stack of remaining thermometer-weighted selectable attenuator cells to be a smaller size configured to withstand only the lower power level; and
(f) configuring and controlling the plurality of thermometer-weighted selectable attenuator cells wherein the attenuator cells having a smaller series stack size cannot be set to an attenuation state until after at least one of the attenuator cells adjacent to each of the first signal port and the second signal port and having a series stack size configured to withstand the maximum power level of the applied signal is set to an attenuation state.

37. The method of claim 36, wherein the applied signal is a radio frequency signal.

38. The method of claim 36, wherein the total minimum series stack size of the plurality of binary-weighted selectable attenuator cells and the plurality of thermometer-weighted selectable attenuator cells is 11.

39. The method of claim 36, wherein the maximum applied signal has a power level of at least about 30 dBm.

40. The method of claim 36, wherein each thermometer-weighted selectable attenuator cell provides no more than about 8 dB of attenuation.

41. The method of claim 36, wherein each thermometer-weighted selectable attenuator cell provides no more than about 4 dB of attenuation.

42. The method of claim 36, further including activating the plurality of thermometer-weighted selectable attenuator cells in a sequence that reduces signal transients in the applied signal when activating different selectable attenuation states.

43. The method of claim 36, further including adding capacitor compensation to at least one selectable attenuator cell to adjust the bandwidth of such cell.

44. The method of claim 36, wherein at least one selectable attenuator cell is a multistate attenuator cell.

45. The method of claim 44, wherein the total minimum series stack size of the plurality of binary-weighted selectable attenuator cells and the plurality of thermometer-weighted selectable attenuator cells is 9.

46. The method of claim 45, wherein each thermometer-weighted selectable attenuator cell provides no more than about 4 dB of attenuation.

\* \* \* \* \*